(12) United States Patent
Yamaguchi

(10) Patent No.: US 8,298,941 B2
(45) Date of Patent: Oct. 30, 2012

(54) METHOD OF MANUFACTURING SEMICONDUCTOR DEVICE

(75) Inventor: Masahiro Yamaguchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 27 days.

(21) Appl. No.: 13/026,830

(22) Filed: Feb. 14, 2011

(65) Prior Publication Data

US 2011/0207322 A1 Aug. 25, 2011

(30) Foreign Application Priority Data

Feb. 19, 2010 (JP) ................................ P2010-034842

(51) Int. Cl.
*H01L 21/44* (2006.01)

(52) U.S. Cl. ... 438/667; 438/669; 438/674; 257/E21.01; 257/E21.577

(58) Field of Classification Search .......................... None
See application file for complete search history.

(56) References Cited

U.S. PATENT DOCUMENTS

| 6,287,968 B1 * | 9/2001 | Yu et al. ........................ 438/675 |
| 7,417,311 B2 | 8/2008 | Yamano |
| 7,468,292 B2 | 12/2008 | Yamano |
| 2012/0111610 A1 * | 5/2012 | Kim et al. ..................... 174/252 |

FOREIGN PATENT DOCUMENTS

| JP | 2005-158929 A | 6/2005 |
| JP | 2005-310817 A | 11/2005 |

* cited by examiner

*Primary Examiner* — Charles Garber
*Assistant Examiner* — Yasser Abdelaziez
(74) *Attorney, Agent, or Firm* — Foley & Lardner LLP

(57) ABSTRACT

A method of manufacturing a semiconductor device includes, but is not limited to, the following processes. A seed layer is formed over a substrate. The seed layer includes first, second, and third portions. A first electrode covering the first portion of the seed layer is formed without forming an electrode on the second and third portions of the seed layer. The third portion of the seed layer is removed so that the first and second portions remain over the substrate, and the first and second portions are separated from each other.

20 Claims, 23 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device (substrate structure) by which warpage thereof is adjustable.

Priority is claimed on Japanese Patent Application No. 2010-034842, filed Feb. 19, 2010, the content of which is incorporated herein by reference.

2. Description of the Related Art

As a substrate structure including a rear electrode penetrating through a substrate (hereinafter, "penetrating electrode"), there have been a wiring board including multiple insulating layers (such as resin layers) over a substrate, a semiconductor device including semiconductor integrated circuits on a semiconductor substrate (such as a semiconductor chip), and the like.

Such a semiconductor device is electrically connected to a semiconductor integrated circuit, and includes a surface electrode electrically connected to the penetrating electrode. When another substrate structure (such as a wiring board or another semiconductor device) is stacked onto the semiconductor device, the substrate structure is connected to the surface electrode or the penetrating electrode.

Regarding the above semiconductor device, semiconductor integrated circuits are formed only on a surface of the semiconductor substrate. For this reason, warpage of the semiconductor device occurs due to the difference in internal stress or thermal expansion coefficient between multiple insulating layers and wiring patterns, which form the semiconductor integrated circuits, and the semiconductor substrate.

Particularly when the vertical size of the semiconductor device is reduced, i.e., when a vertical thickness of a semiconductor substrate is reduced (to, for example, 50 nm), warpage of the semiconductor device is likely to occur. When another substrate structure, such as a wiring board or another semiconductor device, is mounted on the warped semiconductor device, the reliability of electrical connection between the semiconductor device and the substrate structure degrades.

To decrease warpage of the semiconductor device, according to a method disclosed by Japanese Patent Laid-Open Publication No. 2005-158929, multiple semiconductor integrated circuits are formed on a semiconductor wafer. Then, a thickness of a semiconductor substrate is reduced. Then, a metal layer covering a rear surface of the semiconductor substrate is formed as an element for reducing warpage.

According to a method disclosed by Japanese Patent Laid-Open Publication No. 2005-310817, a process of forming an insulating layer covering a rear surface of a semiconductor substrate is additionally provided to reduce warpage of the semiconductor device.

In any case, it is necessary to carry out an additional process of forming a metal layer or an insulating layer that covers a rear surface of the semiconductor substrate to reduce the warpage of the semiconductor device, thereby increasing the number of processes, and therefore causing an increase in manufacturing cost.

The above problem also arises when such a metal layer or an insulating layer is formed on a wiring board including a resin board (such as a glass epoxy board), a ceramic board, or the like. The above problem also arises when an electrode other than a penetrating electrode is provided on a rear surface of a wiring board.

SUMMARY

In one embodiment, a method of manufacturing a semiconductor device includes, but is not limited to, the following processes. A seed layer is formed over a substrate. The seed layer includes first, second, and third portions. A first electrode covering the first portion of the seed layer is formed without forming an electrode on the second and third portions of the seed layer. The third portion of the seed layer is removed so that the first and second portions remain over the substrate, and the first and second portions are separated from each other.

In another embodiment, a method of manufacturing a semiconductor device includes, but is not limited to, the following processes. A first hole is formed in a substrate. A seed layer, which covers an inner surface of the first hole and the substrate, is formed. The seed layer includes first, second, and third portions. A first electrode covering the first portion of the seed layer is formed without forming an electrode on the second and third portions of the seed layer. The first electrode fills the first hole. The third portion of the seed layer is removed so that the first and second portions remain over the substrate, and the first and second portions are separated from each other.

In still another embodiment, a method of manufacturing a semiconductor device includes, but is not limited to, the following processes. A substrate having first and second surfaces is prepared. A wiring structure covering the first surface of the substrate is formed. The wiring structure has a first surface opposing the second surface of the substrate. A first electrode, which partially covers the first surface of the wiring structure, is formed. A seed layer covering the second surface of the substrate is formed. The seed layer includes first, second, and third portions. A second electrode covering the first portion of the seed layer is formed so as to be electrically connected to the first electrode, without forming an electrode on the second and third portions of the seed layer. The third portion of the seed layer is removed so that the first and second portions remain over the second surface of the substrate, and the first and second portions are separated from each other.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment

Figure 1:
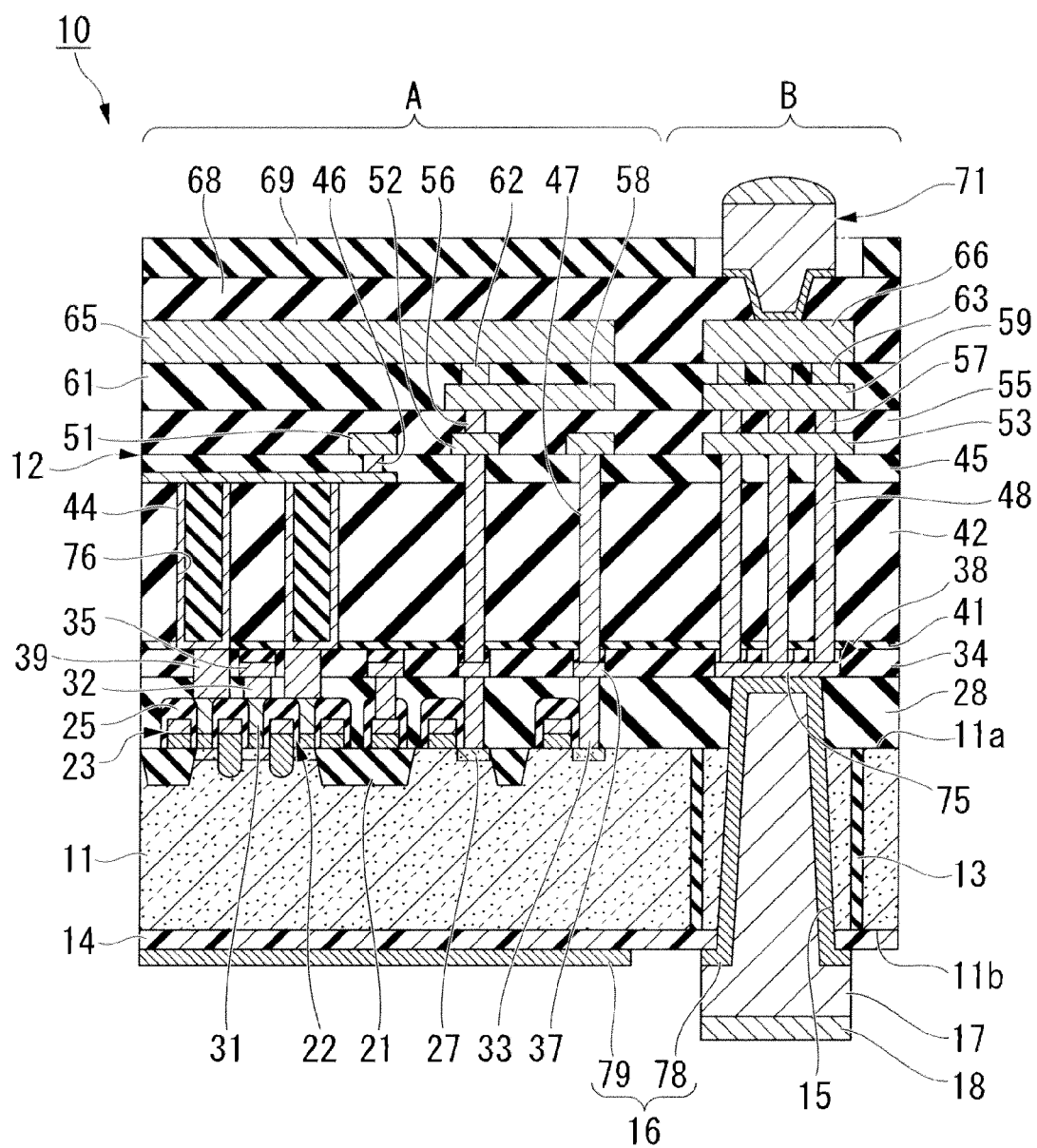
FIG. 1 is a cross-sectional view illustrating a semiconductor device (substrate structure) according to a first embodiment of the present invention.

FIG. 1 is a cross-sectional view illustrating a semiconductor device (substrate structure) 10 according to a first embodiment of the present invention. A DRAM (Dynamic Random Access Memory) is taken as an example of the semiconductor device 10.

The semiconductor device 10 includes: a semiconductor substrate 11; a semiconductor integrated circuit 12; a cylindrical insulator 13; an insulating layer 14; a through hole 15; a rear seed layer 16; a penetrating electrode 17; and a plating layer 18. As a semiconductor substrate 11, a thin silicon substrate having a thickness of, for example, 50 nm may be used.

The semiconductor integrated circuit 12 includes: a memory circuit formation region A in which a memory circuit is formed; a peripheral circuit formation region B in which a peripheral circuit is formed; an device isolation region 21; a gate oxide film (not shown) on a surface 11a of the semiconductor substrate 11; gate electrodes 22 and 23; a sidewall 25; an impurity diffusion layer 27; a first insulating layer 28; a self-alignment contact 31; a bit-line contact 32; a contact plug 33, 47, and 48; a second insulating layer 34; a bit line 35; a first wire 37; a wiring pattern 38 to be connected to a penetrating electrode; a capacitor contact 39; a stopper layer 41; a third insulating layer 42; a capacitor 44; a fourth insulating layer 45; via holes 46, 56, 57, 62, and 63; second wires 51 to 53; a fifth insulating layer 55; third wires 58 and 59; a sixth insulating layer 61; fourth wires 65 and 66; a first protection film 68; a second protection film 69; and a surface electrode 71.

The device isolation region 21 is formed in the semiconductor substrate 11. The device isolation region 21 is adjacent to a surface 11a of the semiconductor substrate 11. The device isolation region 21 is formed by filling a groove with an insulating film, such as a silicon oxide ($SiO_2$) film.

The gate electrodes 22 and 23 are formed over a gate insulating film (not shown) covering a surface 11a of the semiconductor substrate 11 in the memory circuit formation region A. The gate electrode 22 is a multi-layered film including, for example, a poly-silicon film filling a groove in the semiconductor substrate 11 and a tungsten film over the poly-silicon film. The gate electrode 23 is a multi-layered film including, for example, a poly-silicon film and a tungsten film over the poly-silicon film.

The sidewall 25 covers top and side surfaces of each of the gate electrodes 22 and 23. For example, a silicon nitride (SiN) film may be used as the sidewall 25. The impurity diffusion layer 27 is formed in the semiconductor substrate 11 in the memory circuit formation region A. The impurity diffusion layer 27 is adjacent to the surface 11a of the semiconductor substrate 11.

The first insulating layer 28 covers the sidewalls 25 and the surface 11a of the semiconductor substrate 11. For example, a silicon oxide ($SiO_2$) film may be used as the first insulating layer 28.

The self-alignment contact 31 partially penetrates the first insulating layer 28. The self-alignment contact 31 is positioned over the impurity diffusion layer 27 and is electrically connected to the impurity diffusion layer 27.

The bit-line contact 32 partially penetrates the first insulating layer 28 so as to be connected to the self-alignment contact 31. The contact plug 33 is positioned over the impurity diffusion layer 27.

The second insulating layer 34 is formed over the first insulating layer 28. For example, a silicon oxide ($SiO_2$) film may be used as the second insulating layer 34.

The bit line 35 is formed in the second insulating layer 34 so as to be connected to the bit-line contact 32. The first wire 37 is formed in the second insulating layer 34 so as to be connected to the contact plug 33. The first wire 37 is electrically connected to the impurity diffusion layer 27 through the contact plug 33.

The wiring pattern 38 is formed over the first insulating layer 28 in the peripheral circuit region B. The wiring pattern 38 includes a pad portion 75 to be connected to the penetrating electrode 17.

The capacitor contact 39 penetrates the second insulating layer 34 and part of the first insulating layer 28 and is separated from the bit-line contact 32.

The stopper film 41 is formed over the second insulating layer 34. The stopper film 41 functions as an etching stopper when a through hole 76 is formed by an etching process to form the capacitor 44 in the third insulating layer 42. For example, a silicon nitride (SiN) film may be used as the stopper film 41.

The third insulating layer 42 is formed over the stopper film 41, and has the through hole 76 exposing the capacitor contact 39. For example, a silicon oxide ($SiO_2$) film may be used as the third insulating layer 42.

The capacitor 44 includes: a lower electrode covering an inner surface of the through hole 76; a capacitor insulating film covering the lower electrode so as to fill the through hole 76; and an upper electrode over the third insulating layer 42. The upper electrode contacts with the lower electrode and the capacitor insulating film. The upper electrode connects multiple lower electrodes. Upon activation of the gate electrode 22 functioning as a word line, data stored in the capacitor 44 is read out to the bit-line 35 through the impurity diffusion layer 27, the self-alignment contact 31, the bit-line contact 32, and the capacitor contact 39.

The fourth insulating layer 45 is formed over the third insulating layer 42 so as to cover the upper electrode. The via hole 46 partially penetrates the fourth insulating film 45 so as to partially expose the upper electrode.

The contact plug 47 penetrates the stopper layer 41, the third insulating layer 42, and the fourth insulating layer 45 so as to be connected to the first wire 37. The contact plug 48 penetrates the stopper layer 41, the third insulating layer 42, and the fourth insulating film 45 so as to be connected to the pad portion 75.

The second wires 51 to 53 are formed over the fourth insulating layer 45. The second wire 51 is connected to the upper electrode through the via hole 46. The second wire 51 is a wire for supplying a predetermined voltage to the upper electrode.

The second wire 52 is electrically connected to the first wire 37 through the contact plug 47. The second wire 53 is electrically connected to the wiring pattern 38 through the contact plug 48.

The fifth insulating layer 55 is formed over the fourth insulating film 45 so as to cover the second wires 51 to 53. The via hole 56 partially penetrates the fifth insulating layer 55 so as to partially expose the second wire 52. The via hole 56 is positioned in the memory circuit formation region A. The via hole 57 partially penetrates the fifth insulating layer 55 so as to partially expose the second wire 53. The via hole 57 is positioned in the peripheral circuit formation region B.

The third wires 58 and 59 are formed over the fifth insulating film 55 so as to be connected to the via hole 56. The third wire 59 is connected to the via hole 57.

The sixth insulating layer 61 is formed over the fifth insulating layer 55 so as to cover the third wires 58 and 59. The via hole 62 partially penetrates the sixth insulating layer 61 so as to partially expose the third wire 58. The via hole 63 partially penetrates the sixth insulating layer 61 so as to partially expose the third wire 59.

The fourth wires 65 and 66 are formed over the sixth insulating layer 61. The fourth wire 65 is connected to the via hole 62. The fourth wire 66 is connected to the via hole 63. The fourth wire 66 is electrically connected to the wiring pattern 38 through the via hole 63.

The first protection film 68 is formed over the sixth insulating layer 61 so as to cover the forth wires 65 and 66. The first protection film 68 has a hole for forming the surface electrode 71. The hole partially exposes the fourth wire 66. For example, a silicon oxynitride (SiON) film may be used as the first protection film 68.

The second protection film 69 is formed over the first protection film 68. The second protection film 69 has a hole for forming the surface electrode 71. For example, a polyimide film may be used as the second protection film 69.

The surface electrode 71 includes a conductive film (such as a Cu plating film) and a solder portion over the conductive film. The conductive film fills the hole in the first protection film 68 and covers the upper surface of the first protection film 68. The surface electrode 71 extends upwardly from the first protection film 68.

The cylindrical insulator 13 penetrates the semiconductor substrate 11 in the peripheral circuit formation region B so as to surround the penetrating electrode 17. The cylindrical insulator 13 electrically isolates the penetrating electrode 17 from the semiconductor substrate 11 in the memory circuit formation region A. The cylindrical insulator 13 includes, for example, a silicon nitride (SiN) film and a silicon oxide ($SiO_2$) film.

The insulating layer 14 covers a rear surface 11b of the semiconductor substrate 11. The insulating layer 14 isolates the rear seed layer 16 from the semiconductor substrate 11. The through hole 15 penetrates the first insulating layer 28, the semiconductor substrate 11, and the insulating layer 14.

The rear seed layer 16 is a feeder layer used when the penetrating electrode 17 is formed by an electrolytic plating method. The rear seed layer 16 includes: a first seed layer 78 covering an inner surface of the through hole 15, and being covered by the penetrating electrode 17; and a second seed layer 79 electrically isolated from the first seed layer 78.

The first seed layer 78 is a first portion of the seed layer 16, where the penetrating electrode 17 is formed. The second seed layer 79 is a second portion of the seed layer 16, where the penetrating electrode 17 is not formed.

The first and second seed layers 78 and 79 are electrically connected to each other when the penetrating electrode 17 is formed. The second seed layer 79 is a conductive layer that is removed by a method of the related art for manufacturing a semiconductor device. The second seed layer 79 functions as an element for adjusting warpage of the semiconductor device 10.

Thus, warpage of the semiconductor device 10 can be adjusted by forming the second seed layer 79 over the rear surface 11b of the semiconductor substrate 11 (on the opposite side of the insulating layers and the wiring pattern).

Specifically, when the semiconductor device 10 is warped due to the difference in internal stress between the semiconductor integrated circuit 12 and the semiconductor substrate 11 and the difference in thermal expansion coefficient therebetween, the warpage can be reduced by the second seed layer 78 (i.e., the stress acting on the semiconductor device 10 can be cancelled).

For example, when another substrate structure (such as a wiring board or another semiconductor device) is stacked on the semiconductor device 10, thanks to the second seed layer 78, a stack of the substrate structure and the semiconductor device 10 is warped in an integrated manner, thereby increasing the reliability of electrical connection.

The thickness and shape of the second seed layer 79 may be determined according to the purposes (whether to reduce warpage of the semiconductor device 10 or to cause the stack of the substrate structure and the semiconductor device 10 to be warped in an integrated manner).

The provision of the second seed layer 79 is effective for the semiconductor device 10 in which a thickness of the semiconductor substrate 11 is reduced (to, for example, 50 μm), i.e., for a semiconductor device that is likely to be warped.

Figure 2:
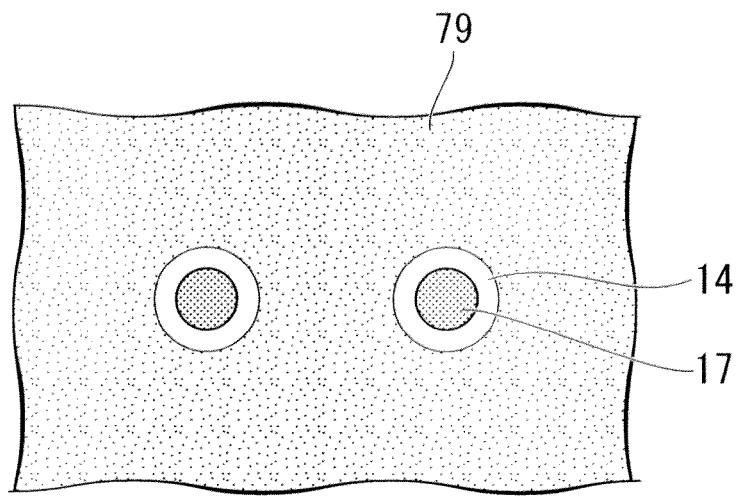
FIG. 2 is a plan view illustrating part of a sheet-like second seed layer having no hole.

FIG. 2 is a plan view illustrating a part of the second seed layer 79 that is a sheet-like pattern having no hole. Like reference numerals denote like elements between FIGS. 1 and 2. An illustration of the plating layer 18 is omitted in FIG. 2 for simplification of explanation.

As shown in FIG. 2, the second seed layer 79 may be a sheet-like pattern having no hole. Such a sheet-like second seed layer 79 can be formed by not removing a portion of the second seed layer 79 positioned outside the first seed layer 78 in the seed layer removal process (as will be explained later with reference to FIG. 15).

Since the second seed layer 79 is a sheet-like pattern, the area of the second seed layer 79 covering the insulating layer 14 can be increased, thereby enabling a reduction in the warpage of the semiconductor device 10.

For example, when the second seed layer 79 is not faulted and when the semiconductor device 10 is warped toward the surface 11a of the semiconductor substrate 11, if the second seed layer 79 is the sheet like pattern, the warpage of the semiconductor device 10 can be greatly reduced.

On the other hand, thanks to the second seed layer 79, a stack of the semiconductor device 10 and another substrate structure is warped in an integrated manner toward the rear surface 11b of the semiconductor substrate 11.

Figure 3:
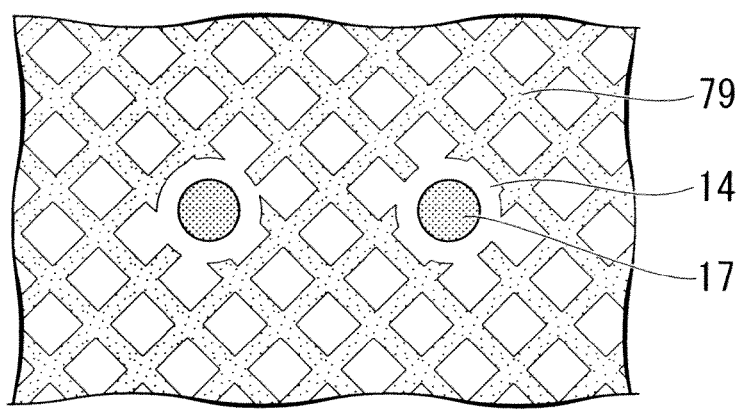
FIG. 3 is a plan view illustrating part of a net-like second seed layer.

FIG. 3 is a plan view illustrating part of the net-like second seed layer 79. Like reference numerals denote like elements between FIGS. 1 and 3. An illustration of the plating layer 18 is omitted for simplification of explanation.

As shown in FIG. 3, the second seed layer 79 may have a net-like shape in plan view. Thereby, the area of the second seed layer 79 covering the insulating layer 14 can be adjusted. Specifically, the area of the second seed layer 79 can be decreased compared to the case where the second seed layer 79 is a sheet-like pattern. Therefore, the effect of the second seed layer 78 on the semiconductor device 10 can be reduced. For this reason, the degree of warpage of the semiconductor device 10 can be scrupulously adjusted.

Also in this case, the degree of warpage of the semiconductor device 10 can be adjusted according to warpage of another substrate structure stacked on the semiconductor device 10.

The shape of the second seed layer 79 is not limited to the net-like shape as long as the area of the second seed layer 79 is adjustable. Additionally, the area of the second seed layer 79 may differ between a greatly warped portion of the semiconductor device 10 and a slightly warped portion of the semiconductor device 10. In other words, the density of the net structure of the second seed layer 79 may differ according to a portion of the semiconductor device 10.

Figure 4:
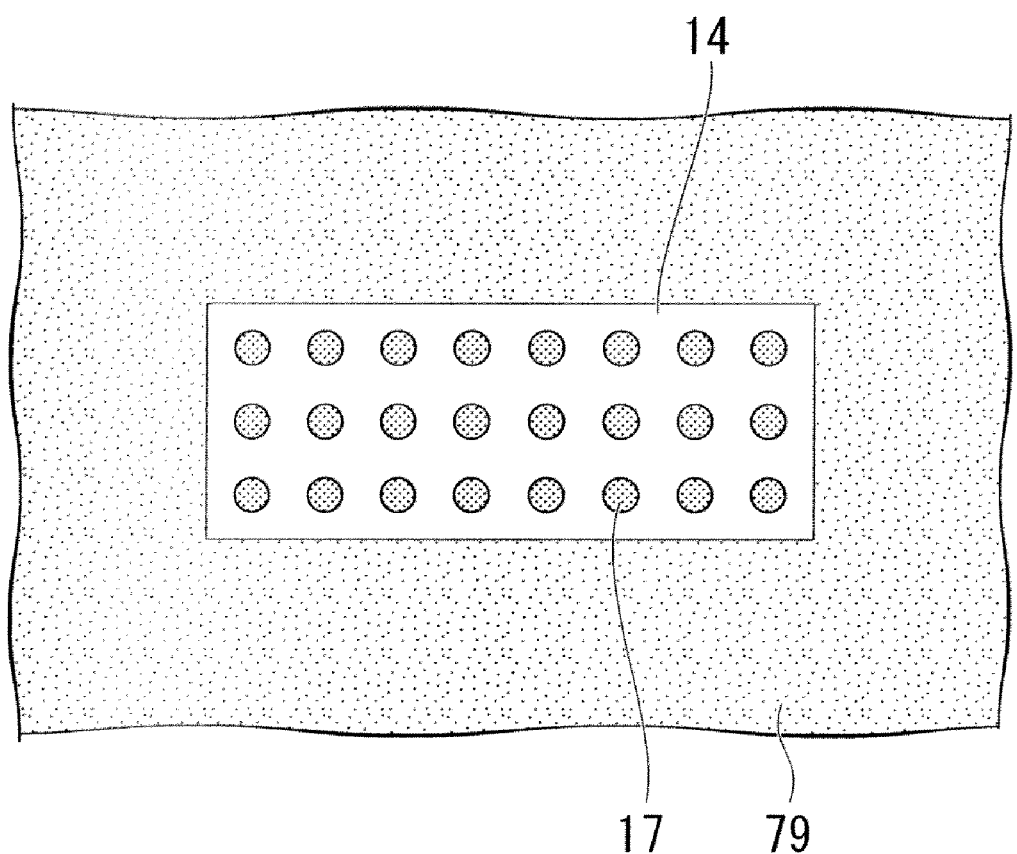
FIG. 4 is a plan view illustrating part of a second seed layer surrounding multiple rear electrodes.

FIG. 4 is a plan view illustrating part of the second seed layer 79 surrounding multiple rear electrodes 17. An illustration of the plating layer 18 is omitted for simplification of explanation. Like reference numeral denotes like elements between FIGS. 1 and 4.

When multiple rear electrodes 17 are densely arranged as shown in FIG. 4, the second seed layer 79 may be arranged so as to surround the rear electrode 79. In this case, a similar effect to that of the sheet-like second seed layer 79 may be achieved. Even in this case, the shape of the sheet-like second seed layer 79 shown in FIG. 4 may be changed to that of the net-like second seed layer 79 shown in FIG. 3.

In the cases of FIGS. 3 and 4, the thickness of the second seed layer 79 may be adjusted so as to adjust the degree of warpage of the semiconductor device 10. Specifically, if the thickness of the second seed layer 79 is reduced, a similar effect to that in the case of the net-like second seed layer 79 can be achieved. On the other hand, if the thickness of the second seed layer 79 is increased, the effect of the second seed layer 79 on the semiconductor device 10 can be increased.

Hereinafter, a method of manufacturing the semiconductor device (substrate structure) 10 according to the first embodiment of the present invention is explained with reference to FIGS. 5 to 16. FIGS. 5 to 16 are cross-sectional views illustrating a process flow indicative of the method of manufacturing the semiconductor device 10. Like reference numerals denote like elements between FIG. 1 and FIGS. 5 to 16.

Figure 5:
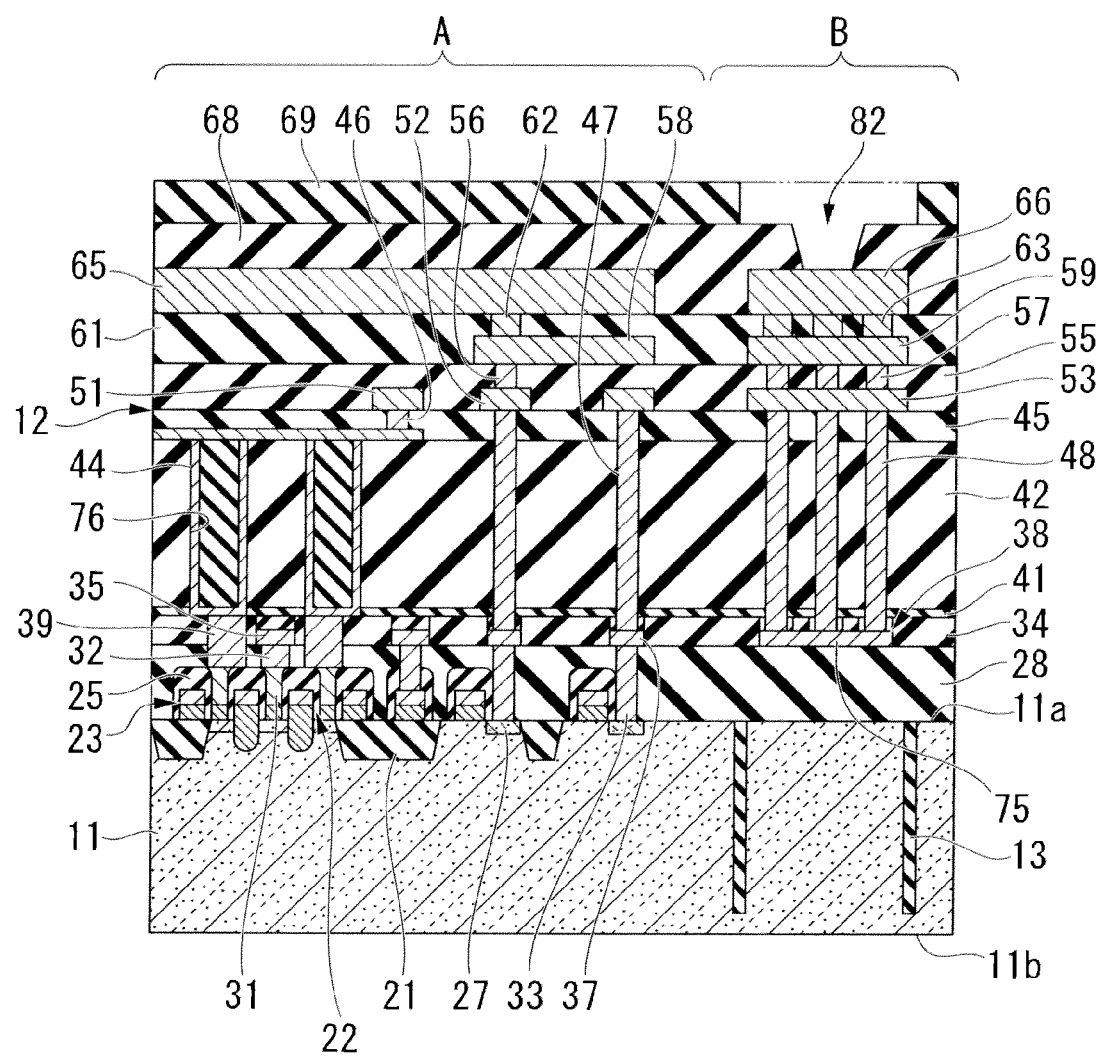
FIGS. 5 to 16 are cross-sectional views illustrating a process flow indicative of a method of manufacturing the semiconductor device according to the first embodiment.

Firstly, in a process shown in FIG. 5, the semiconductor substrate 11 is prepared. A groove is formed in the semiconductor substrate 11 on the side of the surface 11a thereof. Then, a silicon nitride film and a silicon oxide film are formed so as to fill the groove. Thus, the cylindrical insulator 13 is formed. As the semiconductor substrate 11, a semiconductor substrate (such as a silicon wafer), which has multiple device formation regions in which semiconductor devices 10 are formed, may be used. Hereinafter, explanation is given with an example where the semiconductor integrated circuits 12 are formed on the semiconductor substrate 11 having multiple device formation regions.

In the stage of FIG. 5, the cylindrical insulator 13 does not penetrate through the semiconductor substrate 11. In a process of reducing the thickness of the semiconductor substrate 11 as will be explained later, the cylindrical insulator 13 penetrates through the semiconductor substrate 11.

Then, a device isolation region 21 is formed by an STI (Shallow Trench Isolation) method. Then, a trench, in which part of the gate electrode 22 is formed, is formed in the semiconductor substrate 11. Then, a gate oxide film (not shown), which covers the surface 11a of the semiconductor substrate 11, is formed. Then, well regions (not shown) are formed. Then, gate electrodes 22 and 23, which include a poly-silicon film and a tungsten film, are formed. Then, sidewalls 25, which cover the gate electrodes 22 and 23, are formed.

Then, an impurity diffusion layer 27 is formed by ion-implantation in a surface region of the semiconductor substrate 11. Then, the first insulating layer 28 is formed over the surface 11a of the semiconductor substrate 11. Then, the self-alignment contact 31, the bit-line contact 32, and the contact plug 33 are sequentially formed. Then, the bit line 35, the first wire 37, and the wiring pattern 38 are formed. Then, the second insulating layer 34 is formed over the first insulating film 28.

Then, the stopper layer 41 is formed over the second insulating film 34. Then, the third insulating layer 42 is formed over the stopper layer 41. Then, the stopper layer 41 and the third insulating layer 42 are selectively etched to form the through hole 76. Then, the capacitor 44 is formed to cover an inner surface of the through hole 76 and an upper surface of the third insulating layer 42.

Then, the fourth insulating layer 45 is formed over the third insulating layer 42. Then, the via hole 46, the contact plugs 47 and 48, and the second wires 51 to 53 are formed. The via hole 46, the contact plugs 47 and 48, and the second wires 51 to 53 may be formed at the same time.

Then, the fifth insulating layer 55 is formed over the fourth insulating layer 45. Then, the via holes 56 and 57 and the third wires 58 and 59 are formed. Then, the sixth insulating layer 61 is formed over the fifth insulating layer 55.

Then, the via holes 62 and 63, and the fourth wires 65 and 66 are formed. Then, a first protection film 68 (such as a silicon oxynitride film) is formed so as to cover the fourth wires 65 and 66. Then, a second protection film 69 (such as a polyimide film) is formed over the first protection film 68.

Then, a hole 82 for forming the surface electrode 71 is formed by etching the first and second protection films 68 and 69 with a resist film having an opening pattern (not shown) as a mask. The hole 82 penetrates through the first and second protection films 68 and 69 so as to partially expose the fourth wire 66.

Figure 6:
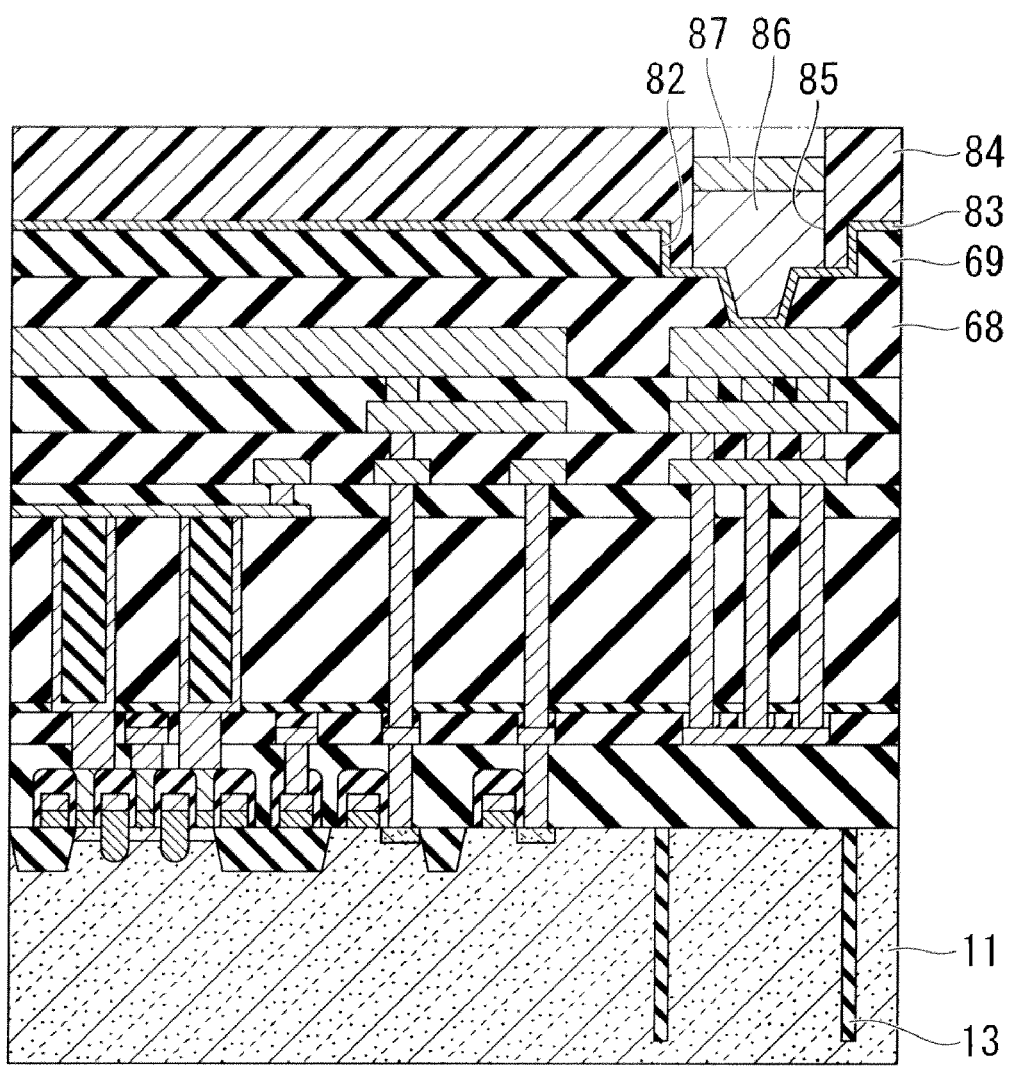

In a process shown in FIG. 6, a surface seed layer 83 is formed so as to cover an inner surface of the hole 82 and an upper surface of the second protection film 69. Then, a plating resist film 84 is formed over the surface seed layer 83. The plating resist film 84 has a hole 85 exposing a portion of the surface seed layer 83 at a position corresponding to that of the surface electrode 71. The surface seed layer 83 includes, for example, a titanium film (having a thickness of 150 and a copper film (having a thickness of 300 nm) which are sequentially deposited.

Then, the a plating film 86 (such as a Cu plating film), which is a basis for the surface electrode 71, is formed so as to fill a bottom portion of the hole 85. Then, a solder plating film 87 is formed over the plating film 86. The plating film 86 and the solder plating film 87 are formed by an electrolytic plating method with the surface seed layer 83 as a feed layer.

Figure 7:
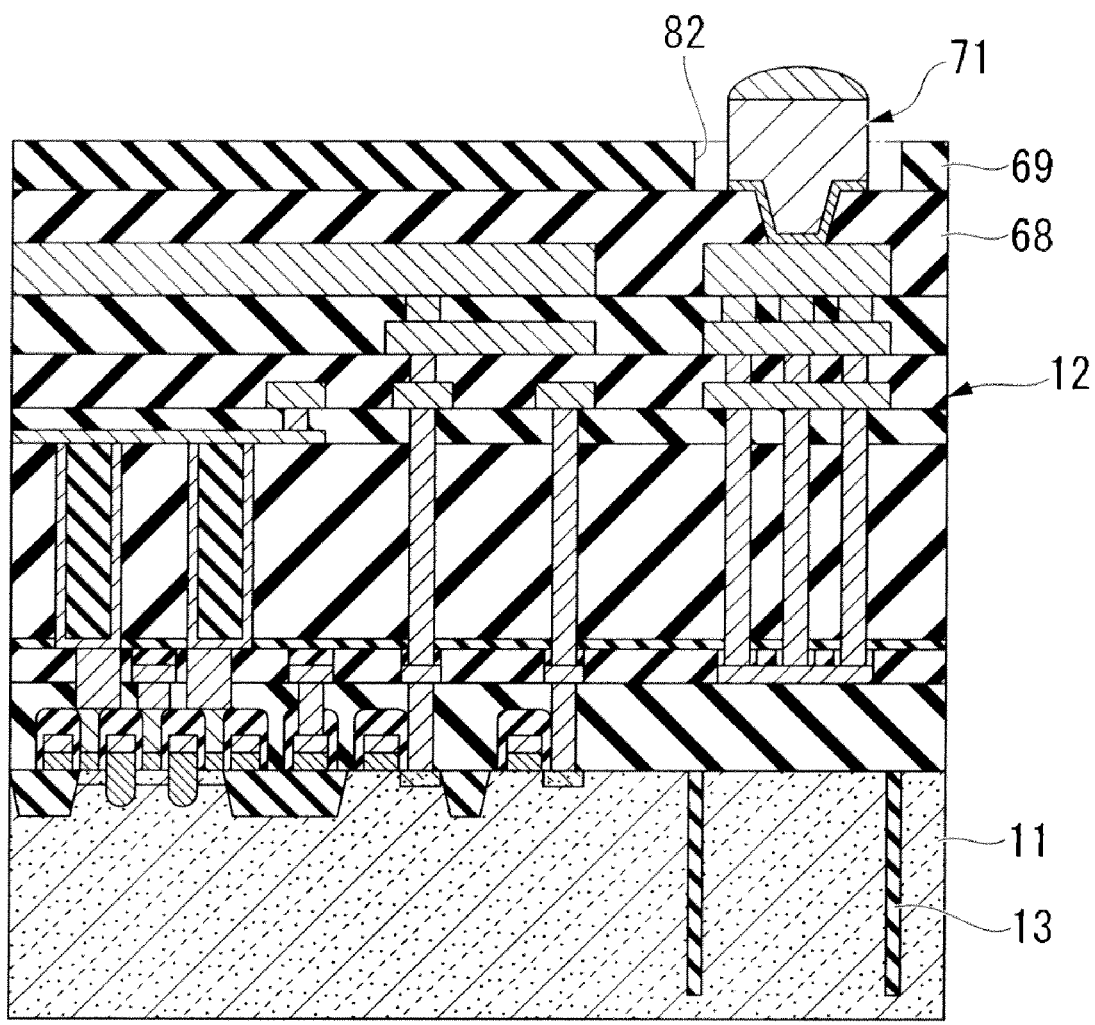

In a process shown in FIG. 7, the plating resist film 84 and a portion of the surface seed layer 83 under the plating resist film 84 (i.e., outside the surface electrode 71) shown in FIG. 6 are removed. Then, the plating film 87 shown in FIG. 6 is reflowed by a thermal treatment process (for example, at a temperature of 240° C. and for 30 seconds) to form a solder bump. Thus, the surface electrode 71 is formed. Thus, multiple semiconductor integrated circuits 12 are formed over the surface 11a of the semiconductor substrate 11. The processes shown in FIGS. 1 to 7 form a structure formation process.

Figure 8:
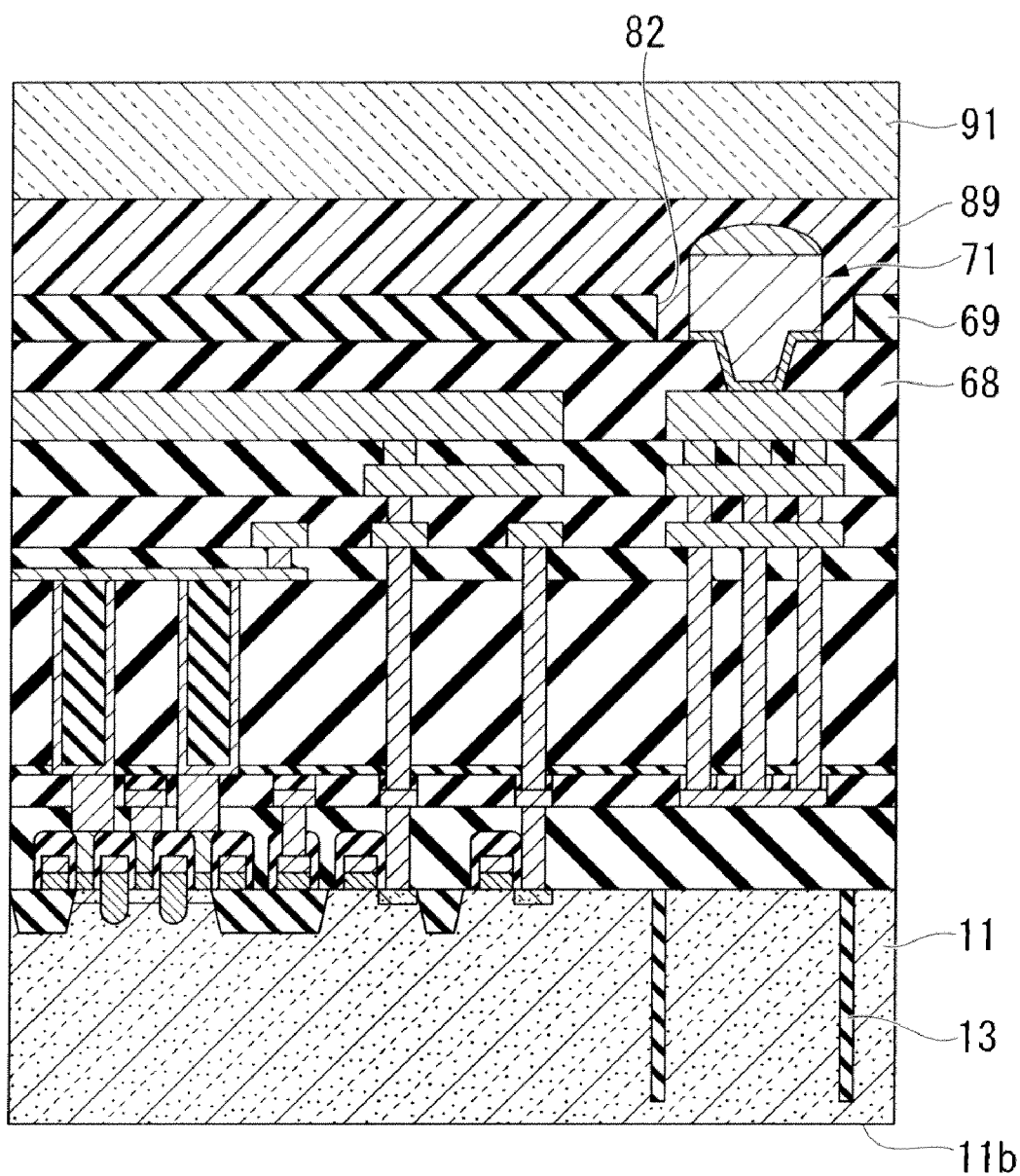

In a process shown in FIG. 8, an adhesive 89, which covers the surface electrode 71, part of the first protection film 68, and the second protection film 69, is formed. Then, a thickness adjustment board 91 (such as a glass board) is fixed onto an adhesive 89. Thus, the thickness of the semiconductor device 10 is adjusted so that the thickness of the semiconductor device 10 after the thickness reduction process shown in FIG. 9 (i.e., the thickness of the structure shown in FIG. 10, which includes the thickness adjustment board 91) equals the thickness of the semiconductor device 10 before the thickness reduction process (i.e., the thickness of the structure shown in FIG. 7, which includes the second protection film 69).

Thus, the thickness adjustment board 91 functions as a reinforcing board in the thickness reduction process. Accordingly, the thickness of the semiconductor substrate 11 can be precisely reduced, and can be kept to the same value during the thickness reduction process. Therefore, the same semiconductor device manufacturing apparatuses (such as a film forming apparatus, an etching apparatus, and a cleaning apparatus) as used before the thickness reduction process, can be used after the thickness reduction process.

Figure 9:
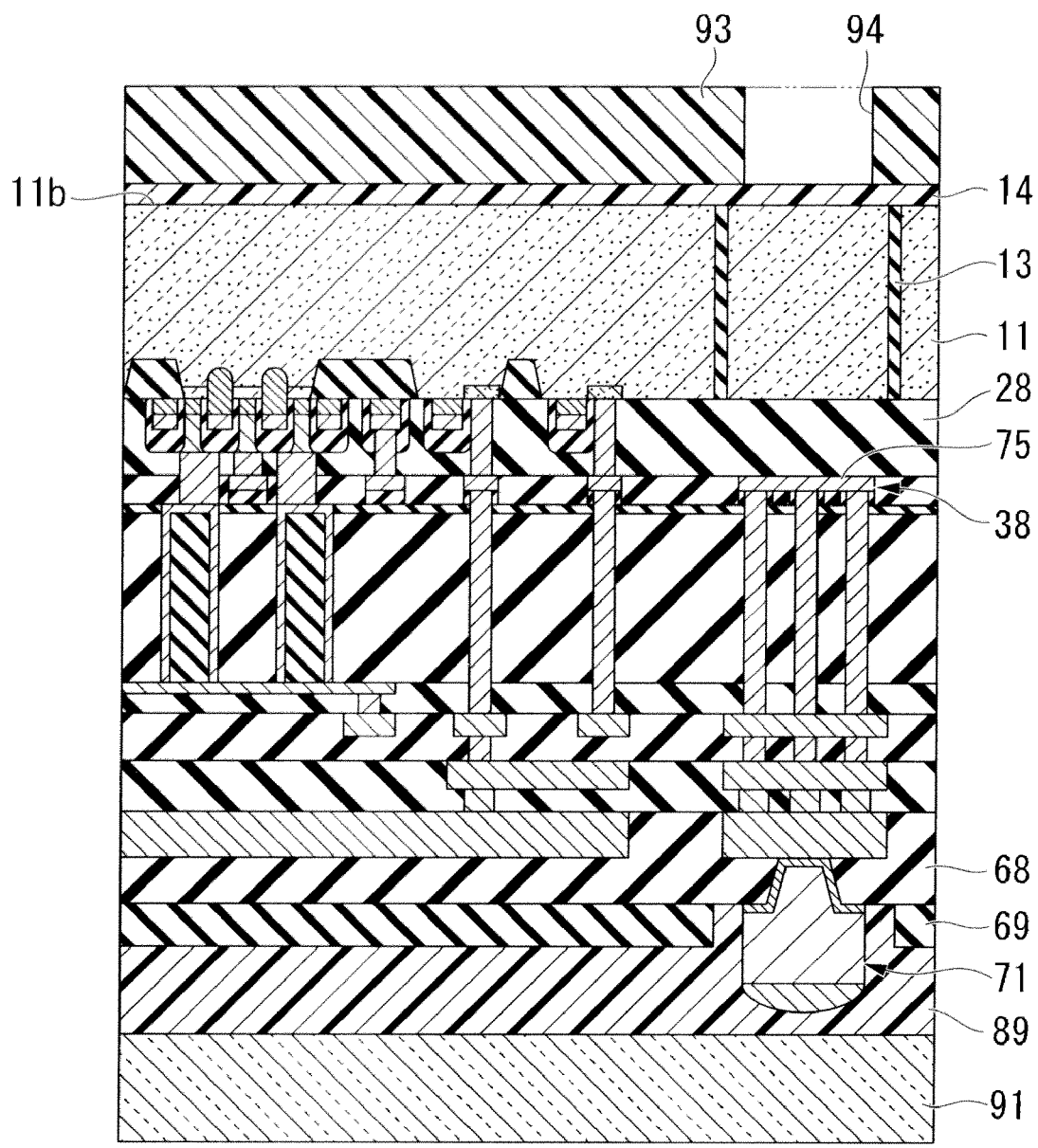

In a process shown in FIG. 9, the rear surface 11b of the semiconductor substrate 11 shown in FIG. 8 is polished or ground to reduce the thickness of the semiconductor substrate 11 to, for example, 50 μm. The polishing process is carried out until the lower end portion of the cylindrical insulator 13 is exposed. For example, a back side grinder may be used for reducing the thickness of the semiconductor substrate 11.

Then, the semiconductor structure including the thinned semiconductor substrate 11 is turned upside down, as shown in FIG. 9. Then, an insulating layer 14 is formed so as to cover the rear surface 11b of the semiconductor substrate 11. For example, a silicon nitride film may be used as the insulating layer 14. Then, an etching resist film 93, which has a hole 94 at a position corresponding to that of the through hole 15 (shown in FIG. 1), is formed over the insulating layer 14.

Figure 10:
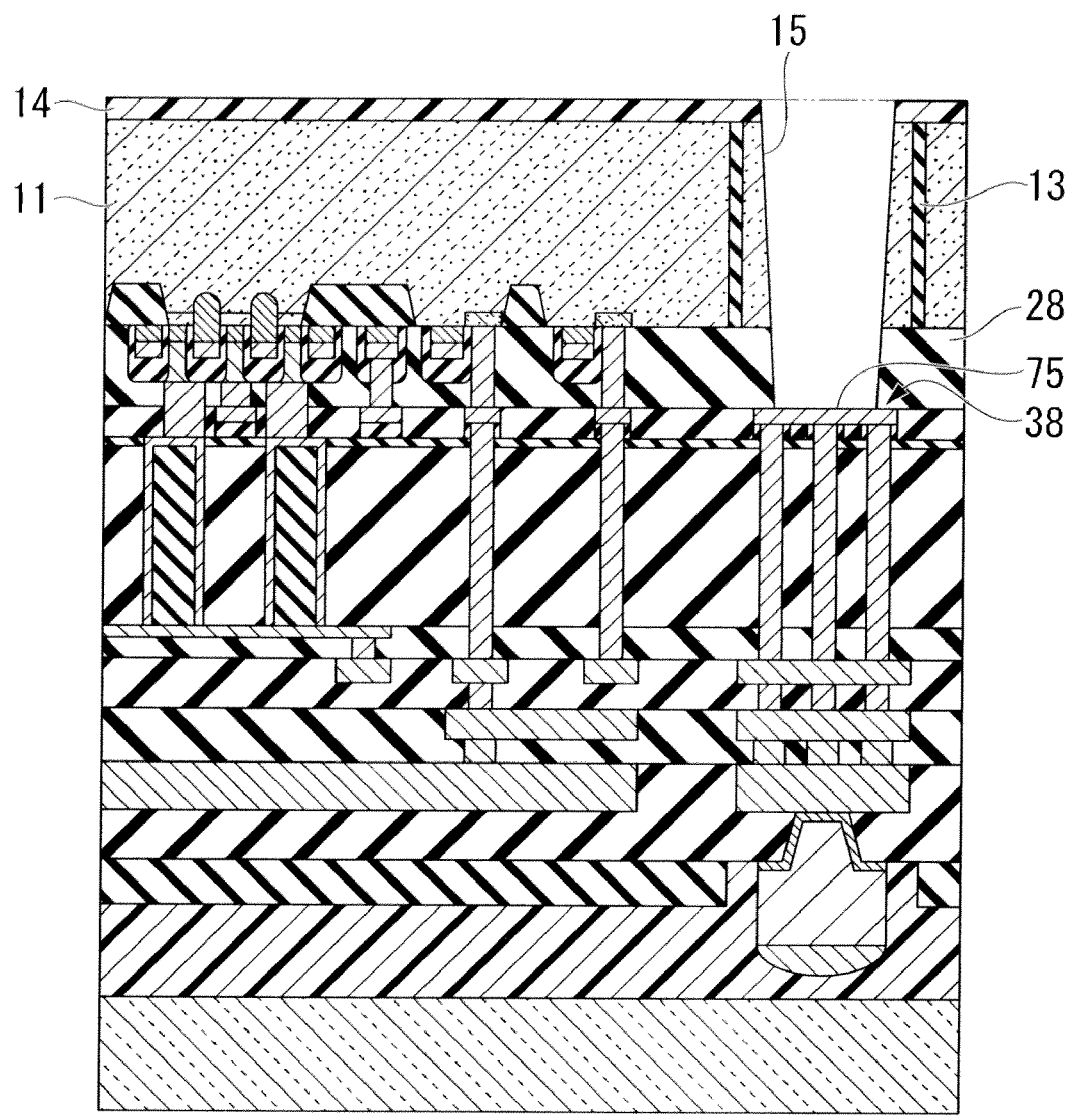

In a process shown in FIG. 10, the semiconductor substrate 11, the insulating layer 14, and the first insulating layer 28 are removed by an anisotropic etching process with the etching resist film 93 shown in FIG. 9 as a mask to form the through hole 15 (through hole formation process) exposing the pad portion 75. Then, the etching resist film 93 shown in FIG. 9 is removed.

Figure 11:
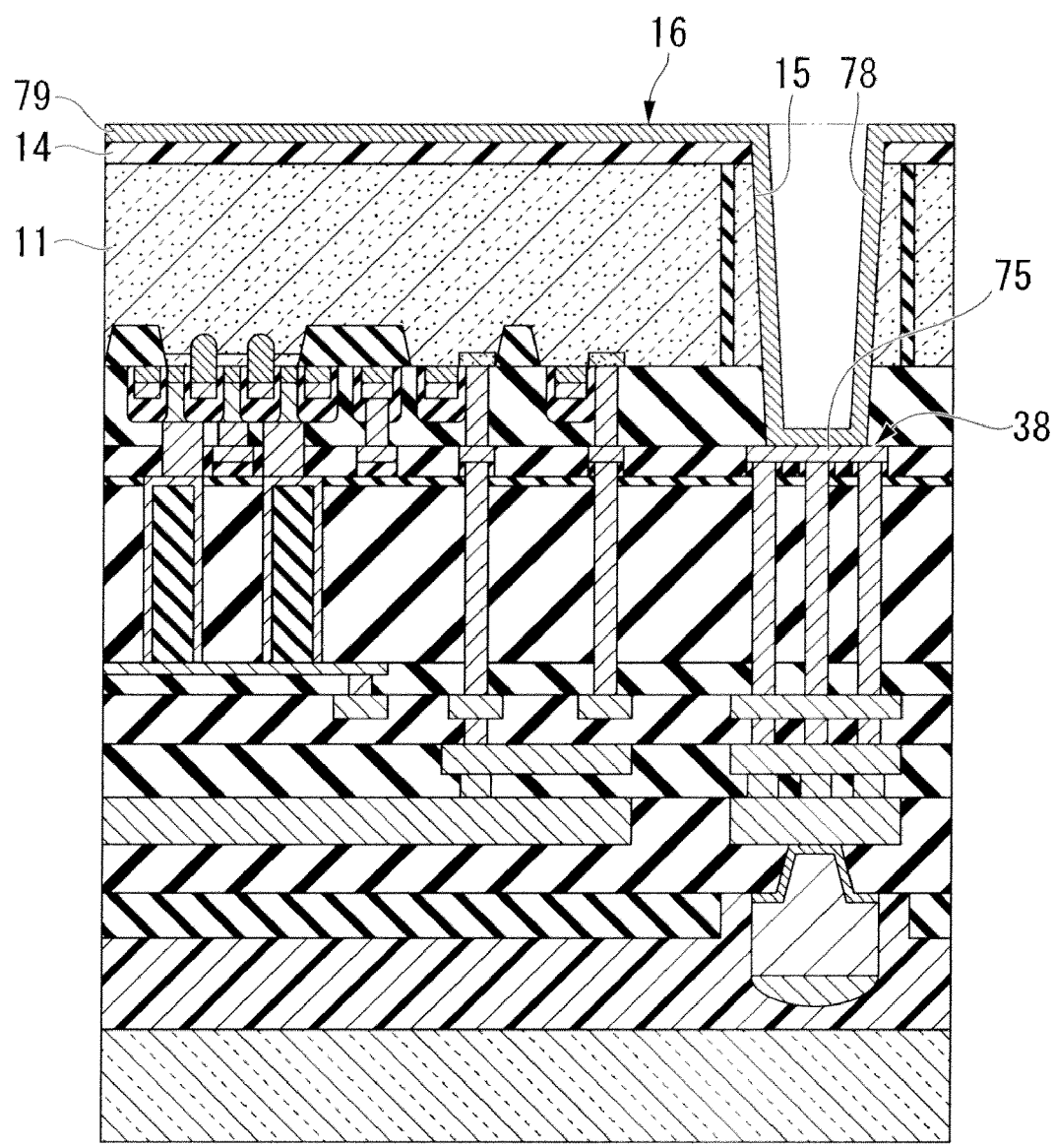

In a process shown in FIG. 11, the rear seed layer 16 is formed by a spattering method so as to cover an upper surface of the insulating layer 14 and an inner surface of the through hole 15 (seed layer formation process). In this stage, the rear seed layer 16 includes the first seed layer 78 (the first portion of the seed layer 16) and the second seed layer 79 (the second portion of the seed layer 16) shown in FIG. 1, which are integrated together.

The rear seed layer 16 is a conductive layer used as a feed layer when the penetrating electrode 17 is formed by an electrolytic plating method. The rear seed layer 16 may be formed by a method other than the spattering method.

The rear seed layer 16 may be a multi-layered film including a titanium film (having a thickness of 150 nm) and a copper film (having a thickness of 600 nm). A value of the thickness of the rear seed layer 16 is not limited to the above value, and may be determined according to purposes (for example, whether to cause a stack of the semiconductor device 10 and another substrate structure to be warped in an integrated manner, or whether to reduce warpage of the semiconductor device 10).

The thickness of the rear seed layer 16 is set to be larger than that of the seed layer 83 that is used when the surface electrode 71 is formed by an electrolytic plating method. Accordingly, the penetrating electrode 17, which is larger in volume than the surface electrode 71, can be properly formed by filling the hole 15 with a plating film.

Figure 12:
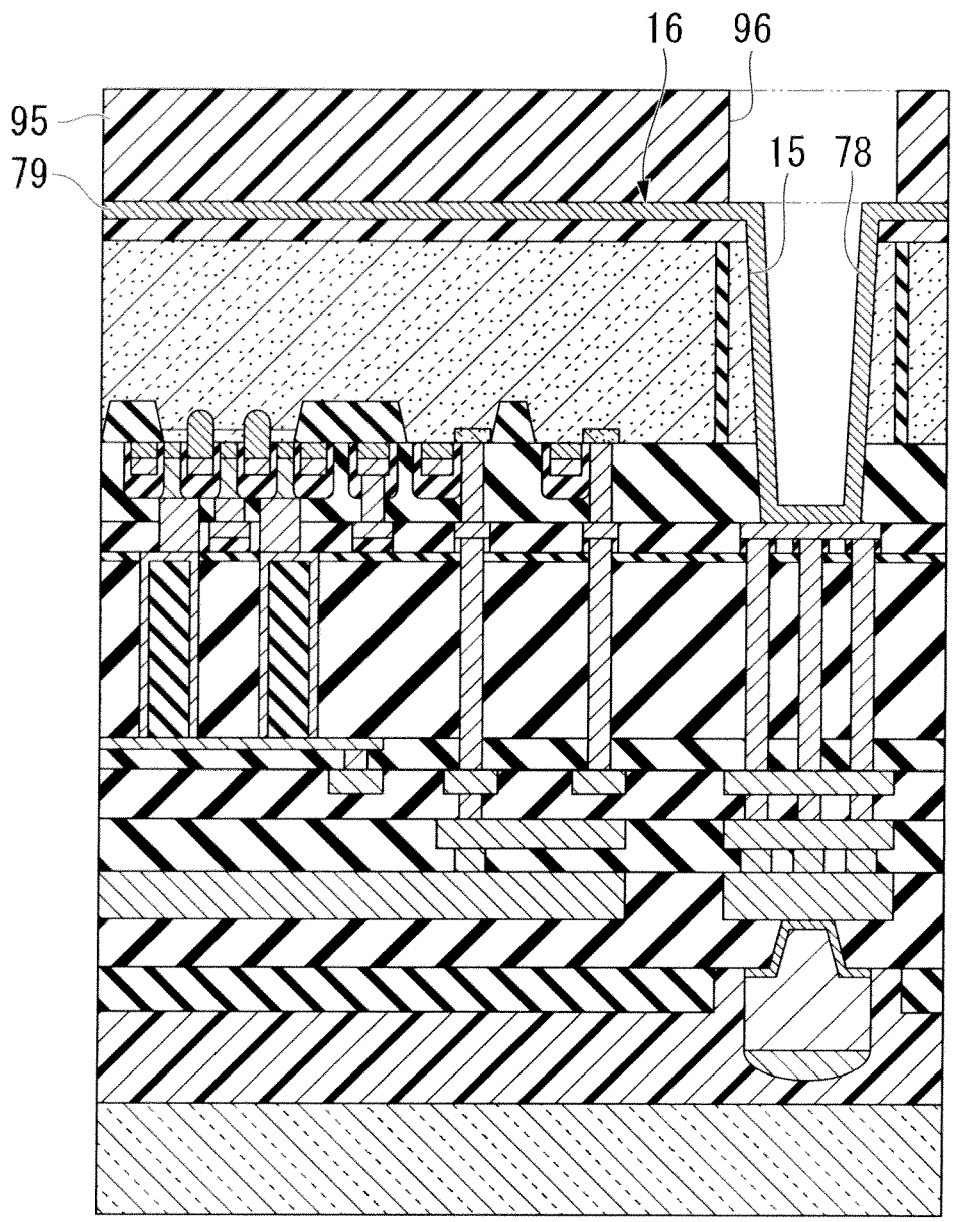

In a process shown in FIG. 12, a plating resist film 95 is formed over the rear seed layer 16. The plating resist film 95 has a through hole 96 over the through hole 15. The diameter of the through hole 96 is preferably larger than that of the through hole 15. Such a shape of the through hole 96 enables easy connection of the semiconductor device 10 and another substrate structure.

Figure 13:
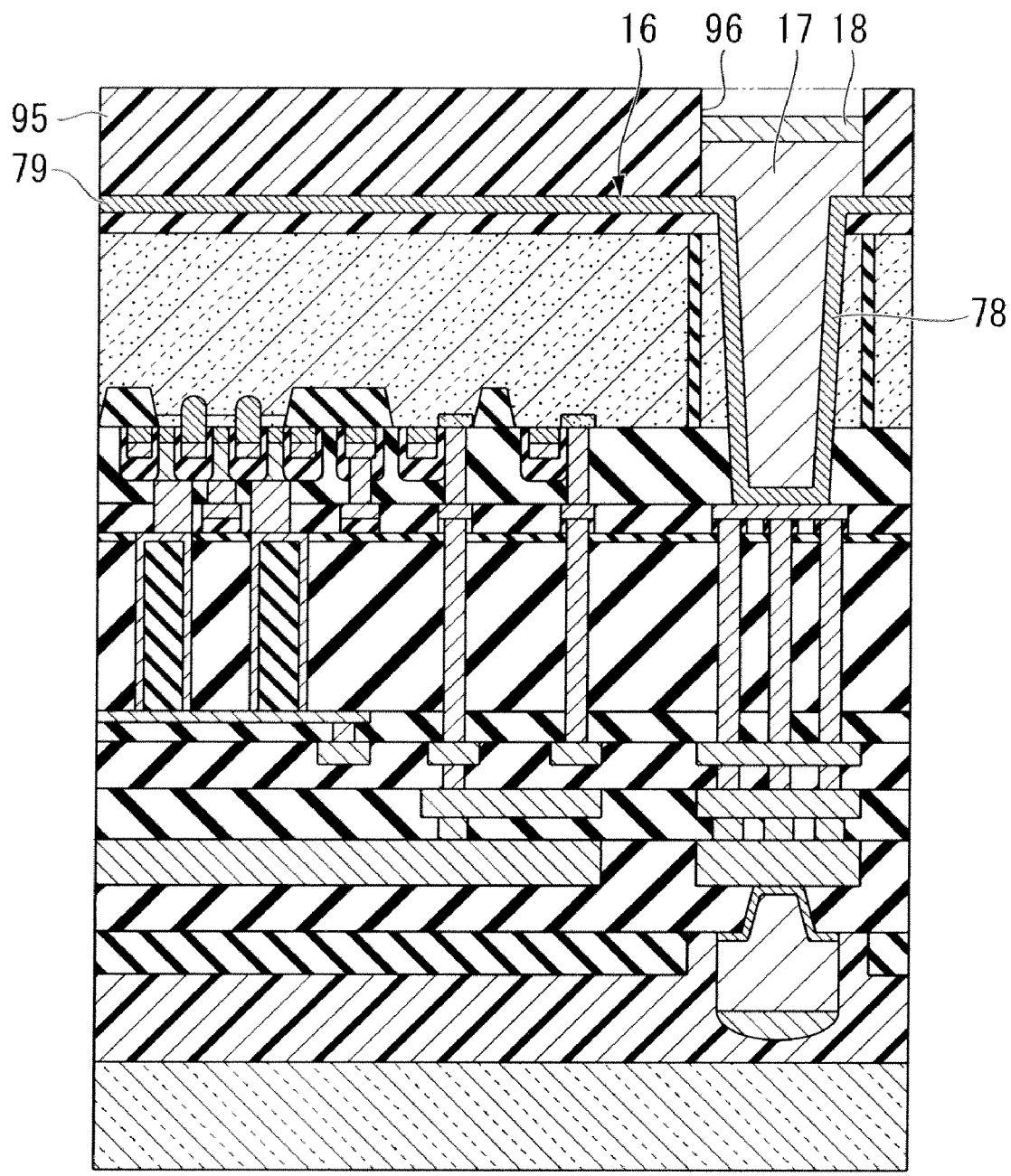

In a process shown in FIG. 13, the penetrating electrode 17, which is made of a plating film such as a copper plating film, is formed so as to fill the through hole 15 and a bottom portion of the through hole 96. The penetrating electrode 17 is formed by an electrolytic plating method with the rear seed layer 16 as a feed layer. Specifically, the plating film is deposited by growth over a portion of the rear seed layer 16 covering the inner surface of the through hole 15. Then, a solder plating film is deposited by growth over the penetrating electrode 17 to form the solder plating layer 18. Then, the solder resist film 95 is removed.

Figure 14:
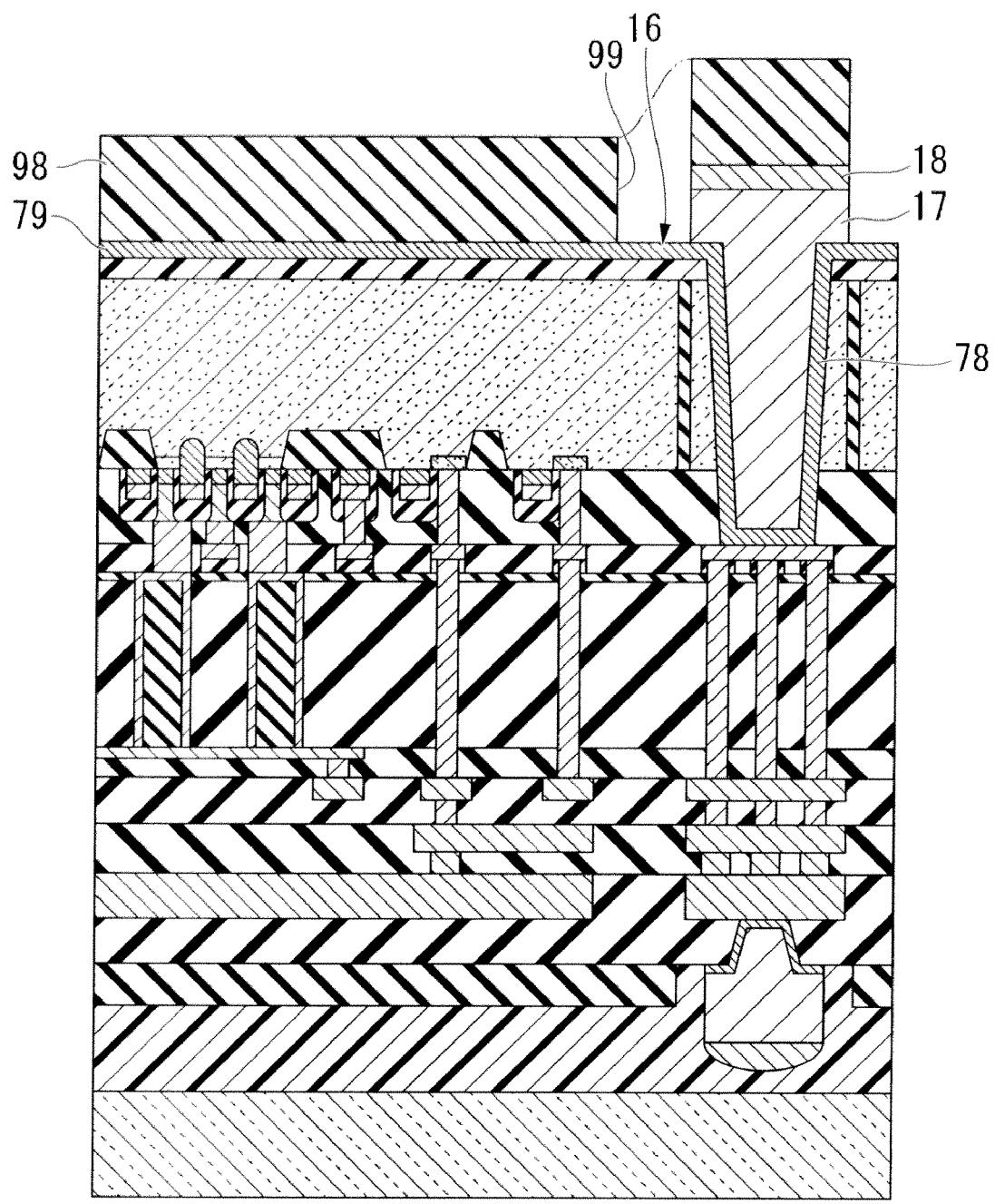

In a process shown in FIG. 14, an etching resist film 98 is formed over the rear seed layer 16 and the plating layer 18. The etching resist film 98 has a through hole 99 exposing a portion of the rear seed layer 16 adjacent to the first seed layer 78, which is positioned between the first and second seed layers 78 and 79. The through hole 99 may have a ring shape in plan view.

Figure 15:
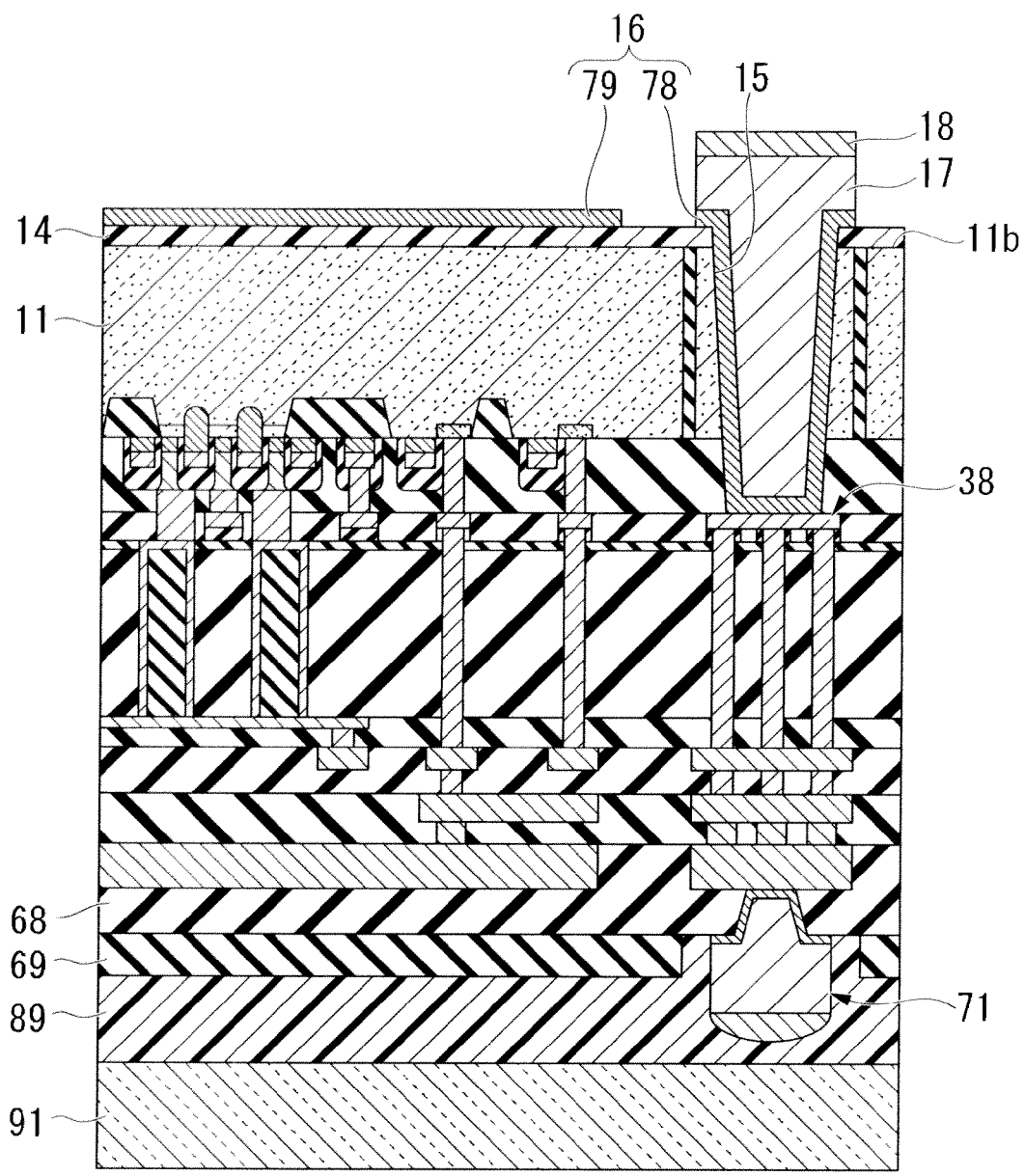

In a process shown in FIG. 15, the portion of the rear seed layer 16 (adjacent to the first seed layer 78), which is exposed to the through hole 99, is removed by an etching process with the etching resist film 98 shown in FIG. 14 as a mask. Thus, the first seed layer 78 is electrically insulated from the second seed layer 79 that is the sheet-like pattern for adjusting warpage of the semiconductor device 10 (seed layer removal process).

The seed layer removal process is not newly provided in the first embodiment. The seed layer removal process is a process of the related art for removing an unnecessary rear seed layer 16 (specifically, a portion of the rear seed layer 16 which is not covered by the penetrating electrode 17).

Thus, the portion of the rear seed layer 16 (i.e., the second seed layer 79), which is used to be removed in the related art, remains in the first embodiment of the present invention. Accordingly, the second seed layer 79, which is a warpage adjustment element, can be formed without providing an additional process of forming an element for adjusting warpage of the semiconductor device 10.

Figure 16:
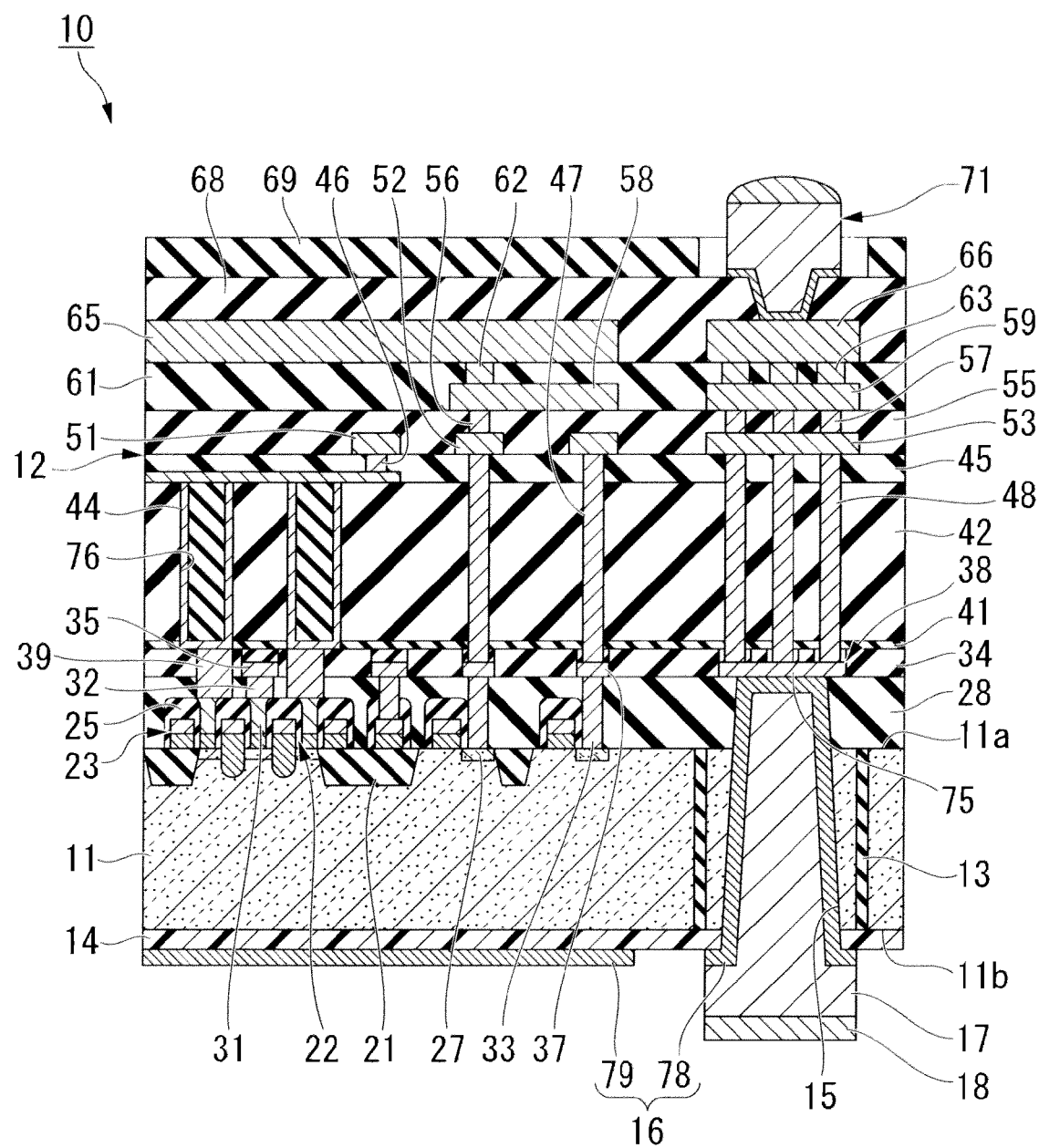

In a process shown in FIG. 16, the adhesive 89 and the thickness adjustment board 91 are removed from the semiconductor structure shown in FIG. 15. Thus, the second protection film 69 and the surface electrode 71 are exposed so that another substrate structure (not shown) can be connected to the surface electrode 71. Thus, the semiconductor device 10 is formed.

When a substrate, such as a silicon wafer, is used as the semiconductor substrate 11, after the thickness adjustment board 91 is removed, the semiconductor substrate 11 is diced with a dicing apparatus. Thus, multiple semiconductor devices 10 of the first embodiment can be manufactured.

According to the method of the first embodiment for manufacturing the semiconductor device, a portion of the rear seed layer 16 (i.e., the second seed layer 79) that is a feed layer for forming the penetrating electrode 17, is not removed as in the related art in which the second seed layer 79 is completely removed. Instead, the second portion of the rear seed layer 16 (i.e., the second seed layer 79) is used as an element for adjusting warpage of the semiconductor device 10. Accordingly, an additional process of forming a warpage adjustment element is not necessary. For this reason, warpage of the semiconductor device 10 can be easily adjusted without increasing the number of processes for forming the semiconductor device 10.

Figure 17:
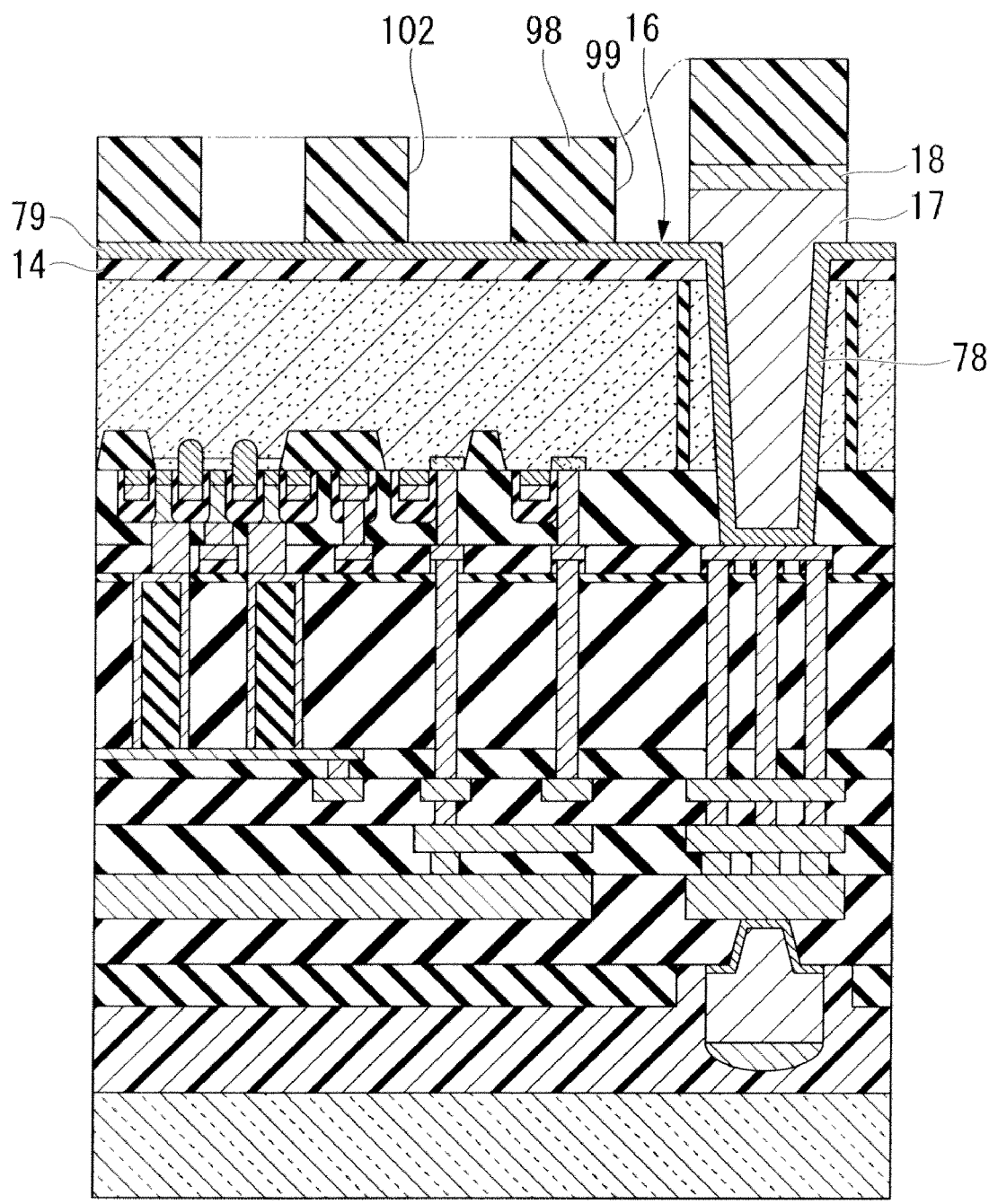
FIGS. 17 to 19 are cross-sectional views illustrating a method of forming the net-like second seed layer according to the first embodiment.
Figure 18:
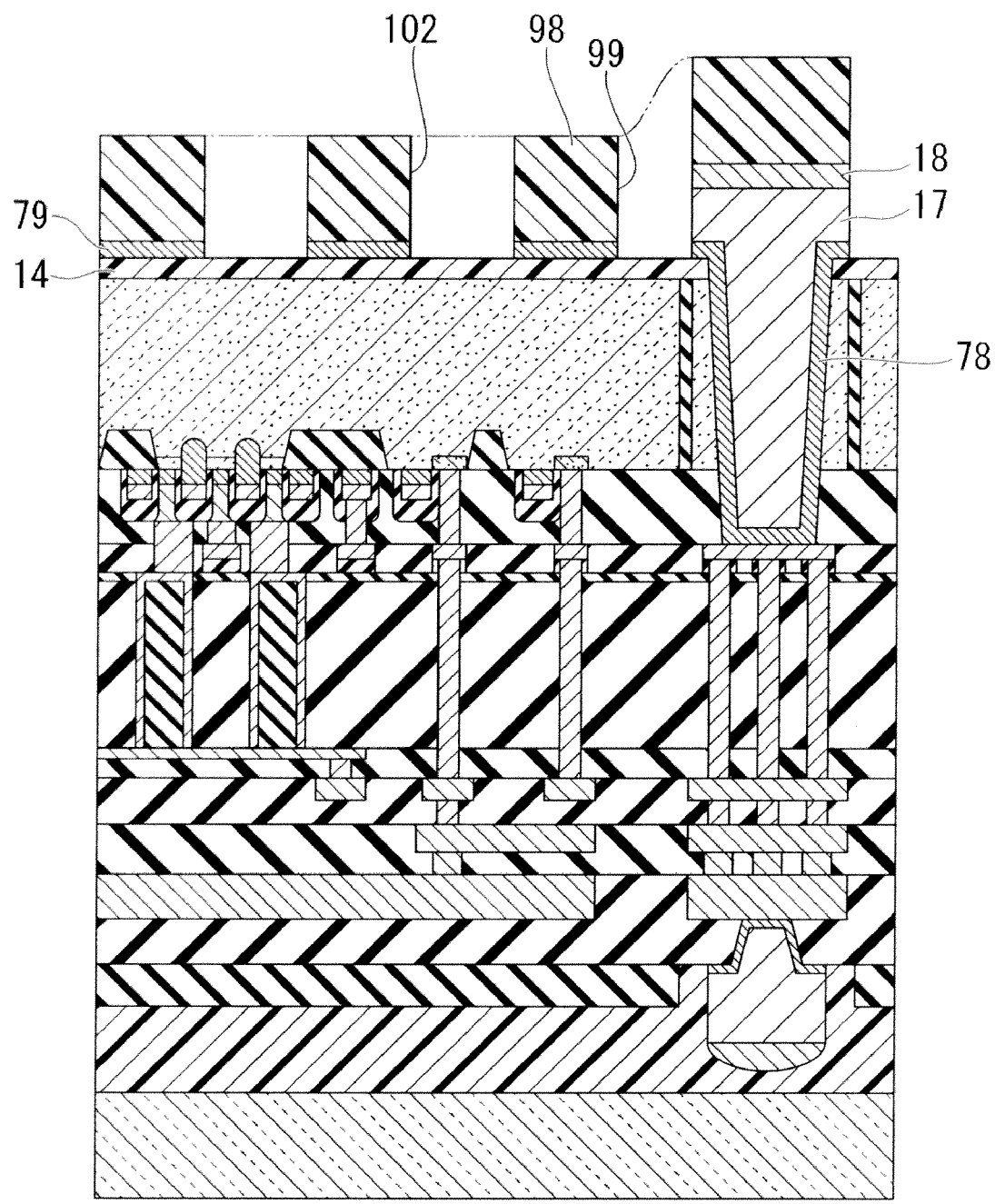
Figure 19:
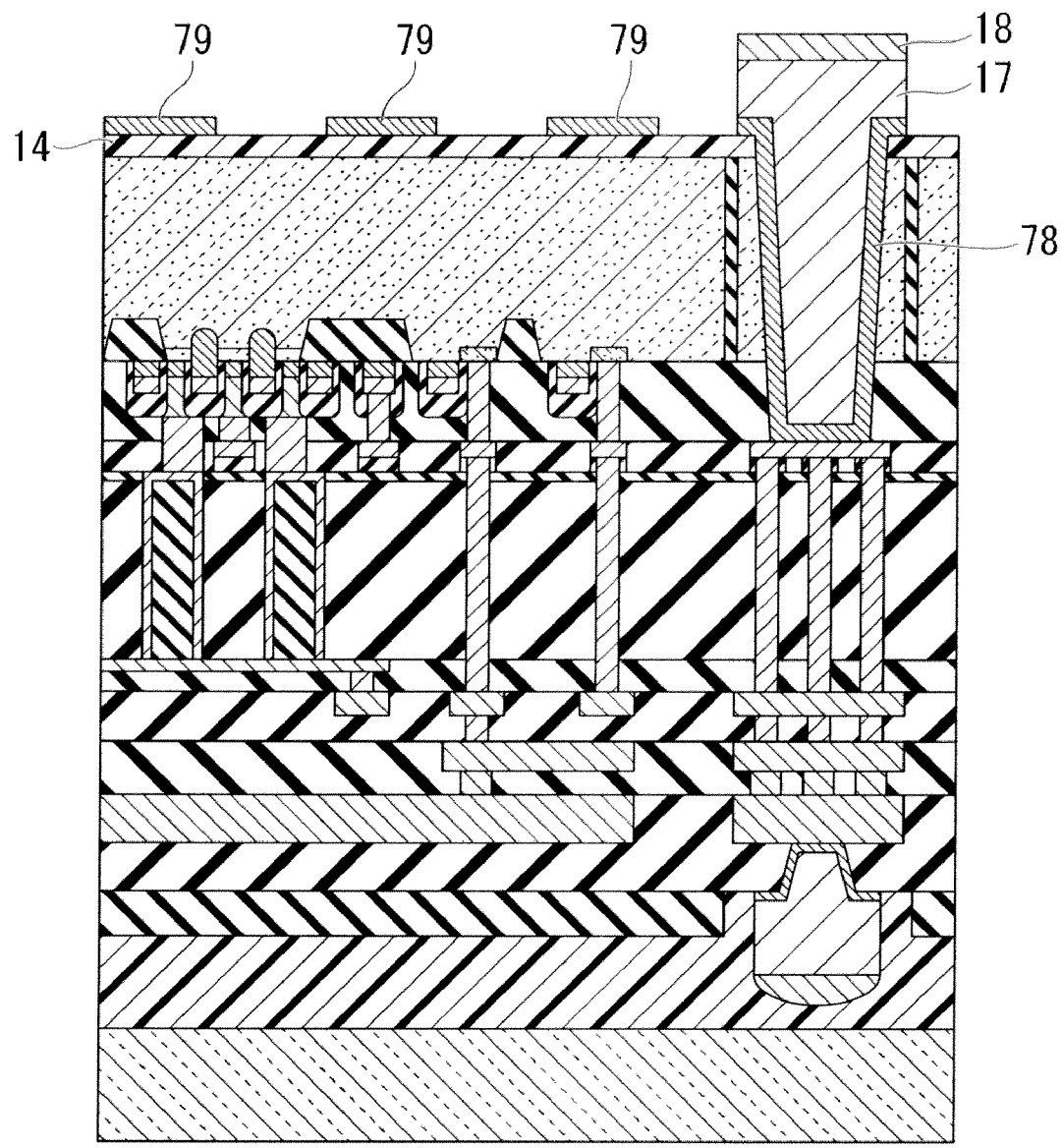

Hereinafter, a method of forming the second seed layer 79 having a net-like shape as shown in FIG. 3 is explained. FIGS. 17 to 19 are cross-sectional views illustrating the method of forming the net-like second seed layer 79. Like reference numerals denote like elements between FIG. 14 and FIGS. 17 to 19.

After similar processes to the aforementioned processes in FIGS. 5 to 13, the plating resist film 95 is removed. Then, in a process shown in FIG. 17, an etching resist film 98 having through holes 99 and 102 is formed over the rear seed layer 16. The through hole 99 exposes a portion of the rear seed layer 16 adjacent to the penetrating electrode 17, which is positioned between the first and second seed layers 78 and 79. The through holes 102 expose portions of the second seed layer 79, which are to be removed. In this stage, the second seed layer 79 does not have a net-like shape.

In a process shown in FIG. 18, the second seed layer 79 is removed with the etching resist film 98 as a mask. Thus, the portion of the rear seed layer 16 adjacent to the penetrating electrode 17, which is positioned between the first and second seed layers 78 and 79, and a part of the second seed layer 79 are removed (seed layer removal process).

Thus, the first seed layer 78 is electrically isolated from the second seed layer 79. Further, the second seed layer 79 has a net-like shape as shown in FIG. 3. In a process shown in FIG. 19, the etching resist film 98 shown in FIG. 18 is removed.

According to the method of the first embodiment for forming the net-like second seed layer 79, the holes 102 exposing part of the second seed layer 79 is formed in the etching resist film 98 used for etching a portion of the rear seed layer 16 adjacent to the penetrating electrode 17, which is positioned between the first and second seed layers 78 and 79. Then, the rear seed layer 16 is etched with the etching resist film 98 having the holes 99 and 102 as a mask. Thereby, the net-like second seed layer 79 can be formed without providing an additional process of making the shape of the second seed layer 79 net-like. In other words, the net-like second seed layer 79, which is a warpage adjustment element, can be formed without increasing the number of processes for manufacturing the semiconductor device 10.

Second Embodiment

Figure 20:
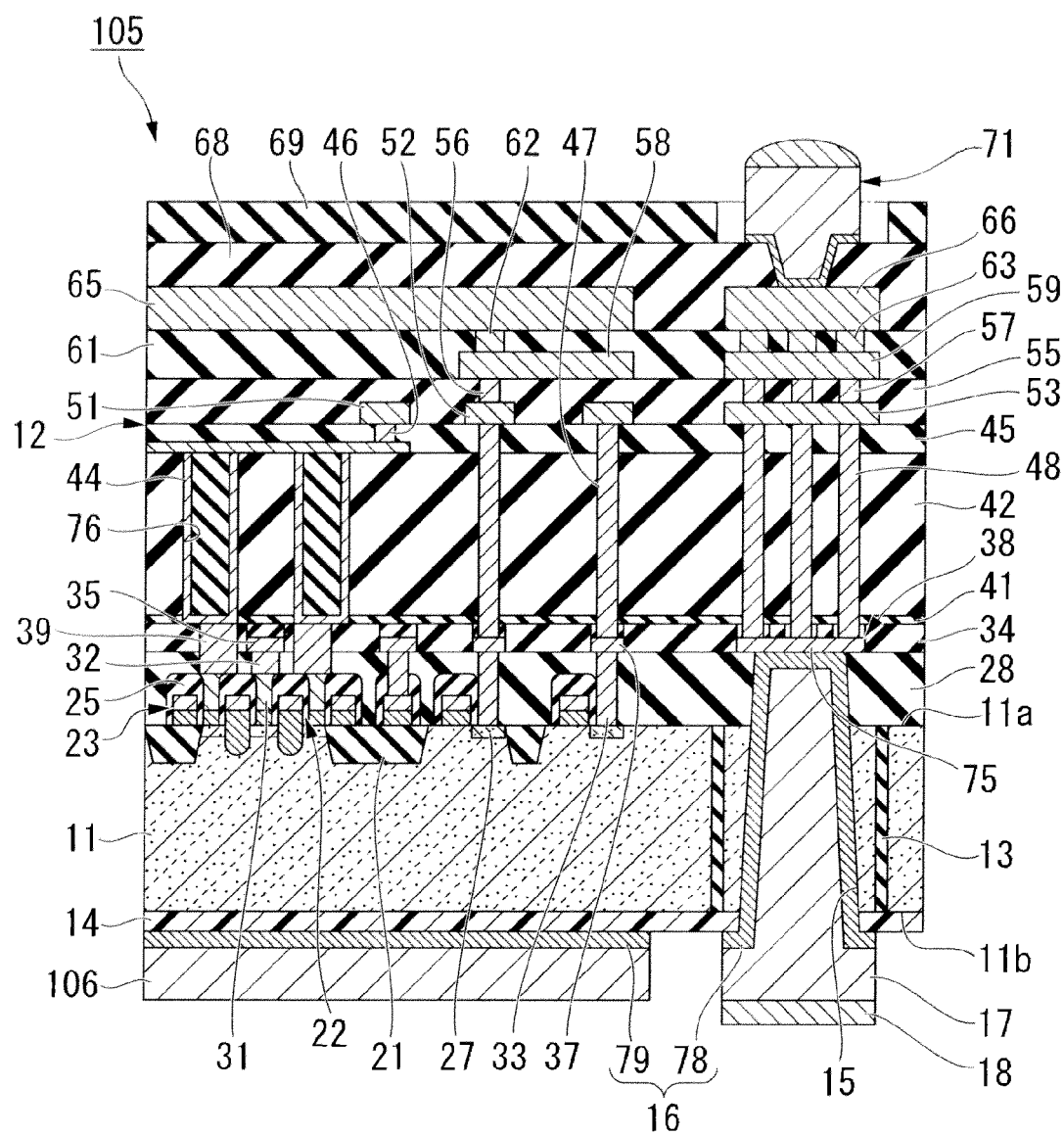
FIG. 20 is a cross-sectional view illustrating a semiconductor device (substrate structure) according to a second embodiment of the present invention.

FIG. 20 is a cross-sectional view illustrating a semiconductor device (substrate structure) 105 according to a second embodiment of the present invention. Like reference numerals denote like elements between first and second embodiments.

The semiconductor device 105 of the second embodiment differs from the semiconductor device 1 of the first embodiment in that a plating film 106 (such as a Cu-plating film) is formed so as to cover the sheet-like second seed layer 79. The bottom level of the plating film 106 covering the second seed layer 79 is substantially equal to the bottom level of the plating film (forming the penetrating electrode 17) covering the first seed layer 78. The second seed layer 79 and the plating film 106 function as elements for adjusting warpage of the semiconductor device 105.

The provision of the plating film 106 covering the sheet-like second seed layer 79 enables a reduction in warpage of the semiconductor device 105 toward the surface electrode 71. Additionally, adjustment of the thickness of the plating film 106 enables adjustment of warpage of a stack of the semiconductor device 105 and another substrate structure (not shown) electrically connected to the semiconductor device 105 through the surface electrode 71 or the plating layer 18. Accordingly, the reliability of electrical connection between the semiconductor device 105 and another substrate structure can be enhanced.

Figure 21:
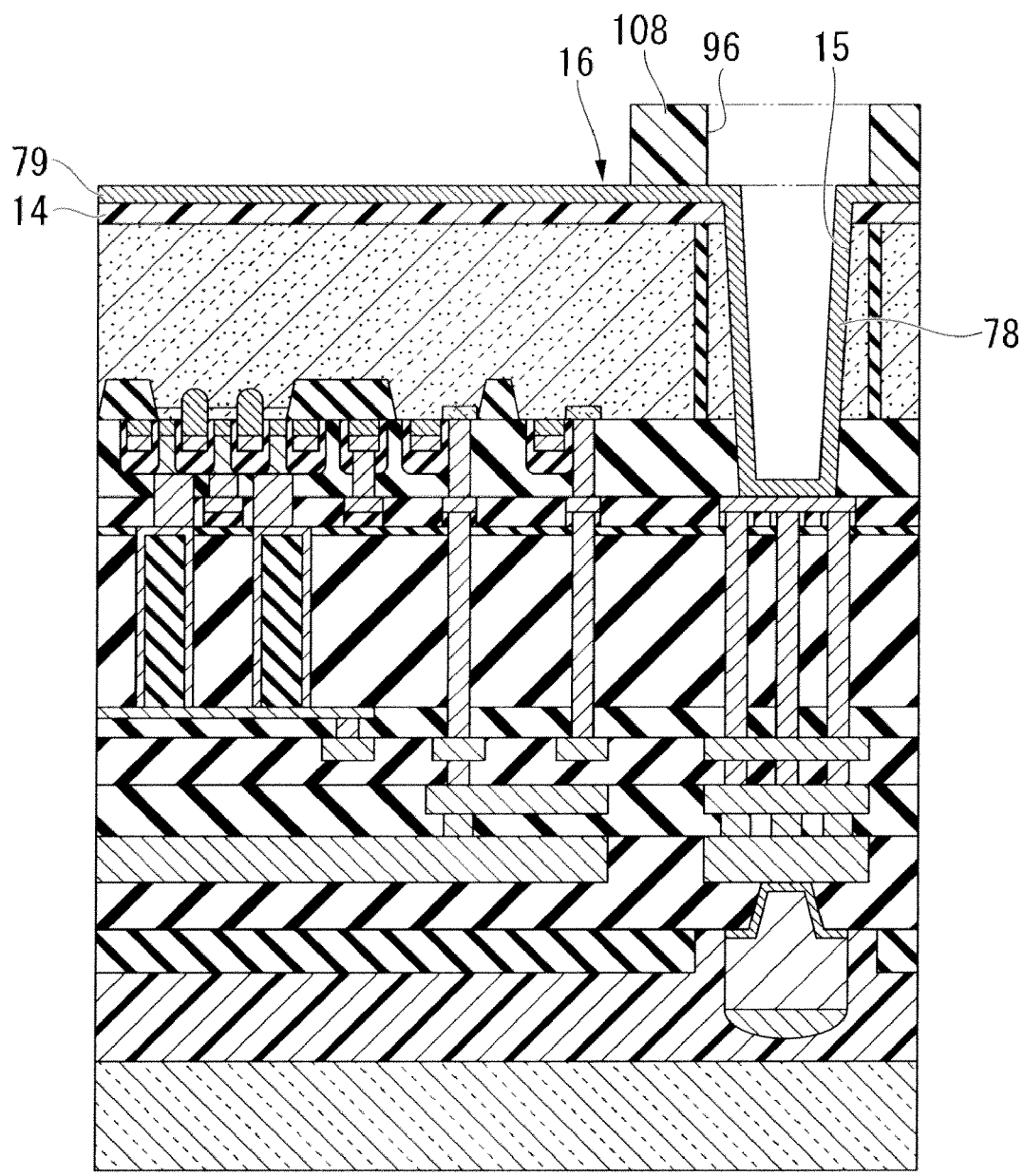
FIGS. 21 and 22 are cross-sectional views illustrating a method of forming a plating film of the second embodiment.
Figure 22:
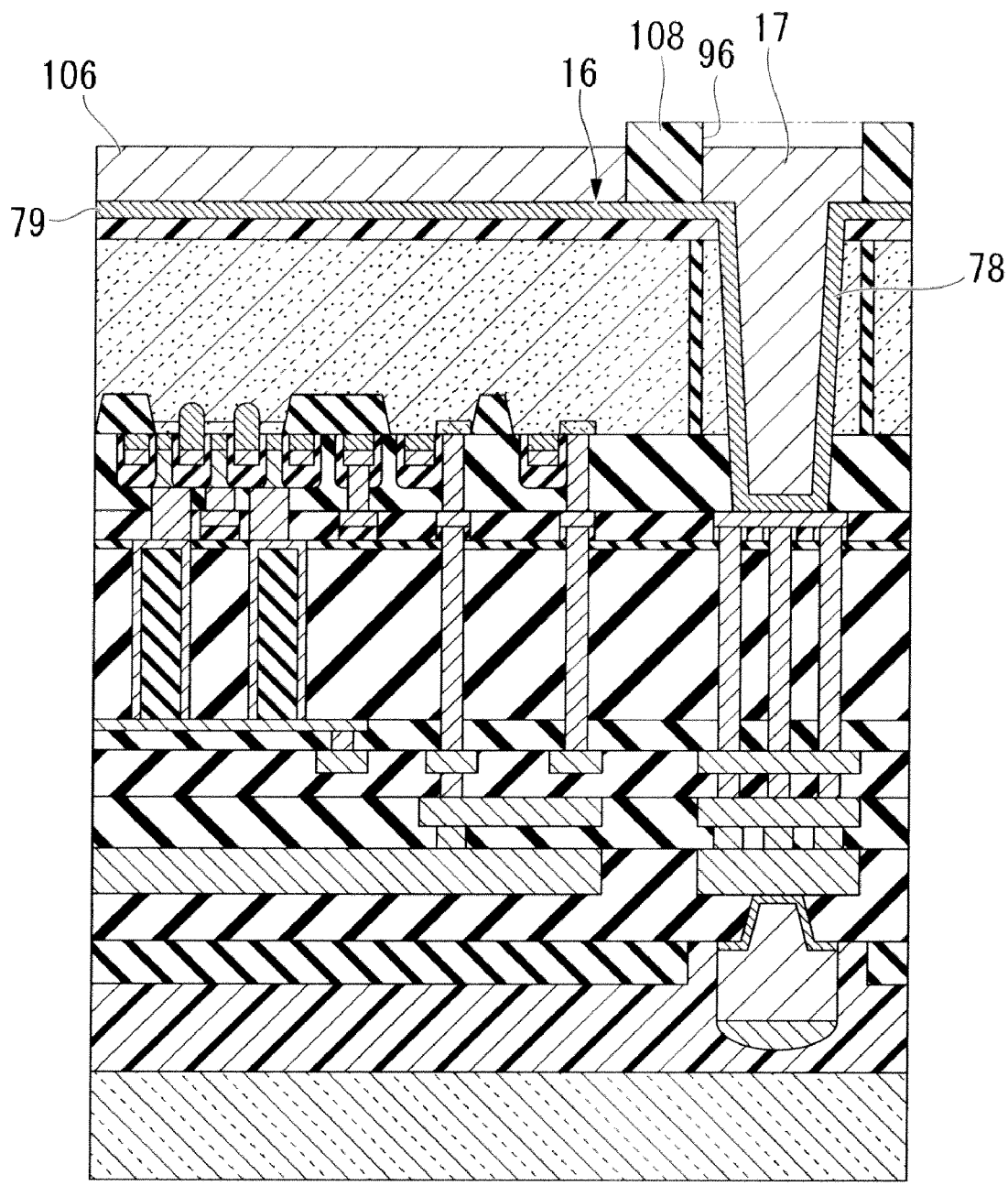

Hereinafter, a method of forming the plating film 106 is explained. FIGS. 21 and 22 are cross-sectional views illustrating the method of forming the plating film 106. Like reference numerals denote like elements between first and second embodiments.

After similar processes shown in FIGS. 5 to 13 are carried out, in a process shown in FIG. 21, a plating resist film 108 is formed so as to cover a portion of the rear seed layer 16 adjacent to the through hole 15, which is positioned between the first and second seed layers 78 and 79. The plating resist film 108 has a hole 96 exposing the first seed layer 78. The plating resist film 108 does not cover the region of the second seed layer 79.

In a process shown in FIG. 22, the plating film 106 and the penetrating electrode 17 are formed at the same time (electrode formation process). Specifically, a plating film (such as a Cu plating film) is deposited by growth over the portions of the first and second seed layers 78 and 79, which are not covered by the plating resist film 108. The formation of the plating film is carried out by an electrolytic plating method with the rear seed layer 16 as a feed layer. Thus, the penetrating electrode 17 made of the plating film is formed so as to fill the through hole 15 and part of the through hole 96. At the same time, the plating film 106 is formed over the second seed layer 79.

Thus, the plating resist film 108 is formed so as to cover the portion of the rear seed layer 16 adjacent to the through hole 15 between the first and second seed layers 78 and 79 when the penetrating electrode 17 is formed by an electrolytic method. Then, the plating film is deposited by growth over the first and second seed layers 78 and 79 using the electrolytic method with the rear seed layer 16 as a feed layer. Thus, the penetrating electrode 17 and the plating film 106 are formed at the same time. Thereby, an additional process of forming the plating film 106 is not necessary. Accordingly, the plating film 106, which functions as an element for adjusting warpage of the semiconductor device 105, can be simply formed without increasing the number of processes of forming the semiconductor device 105.

After the plating film 106 and the penetrating electrode 17 are faulted at the same time in the electrode formation process, the plating resist film 108 is removed. Then, the plating resist film 95 having the through hole 96 shown in FIG. 13 is formed over the rear seed layer 16 so as to cover the plating film 106 and a portion where the plating resist film 108 has been present. Then, the plating layer 18 is formed by an electrolytic plating method over the penetrating electrode 17 exposed to the through hole 96. Then, the plating resist film 95 is removed. Then, similar processes to those shown in FIGS. 14 to 16 are carried out. Thus, the semiconductor device 105 can be formed.

Although the case where the plating film 106 is formed over the sheet-like second seed layer 79 has been explained in the second embodiment, the plating film 106 may be formed over the net-like second seed layer 79 shown in FIG. 3.

Third Embodiment

Figure 23:
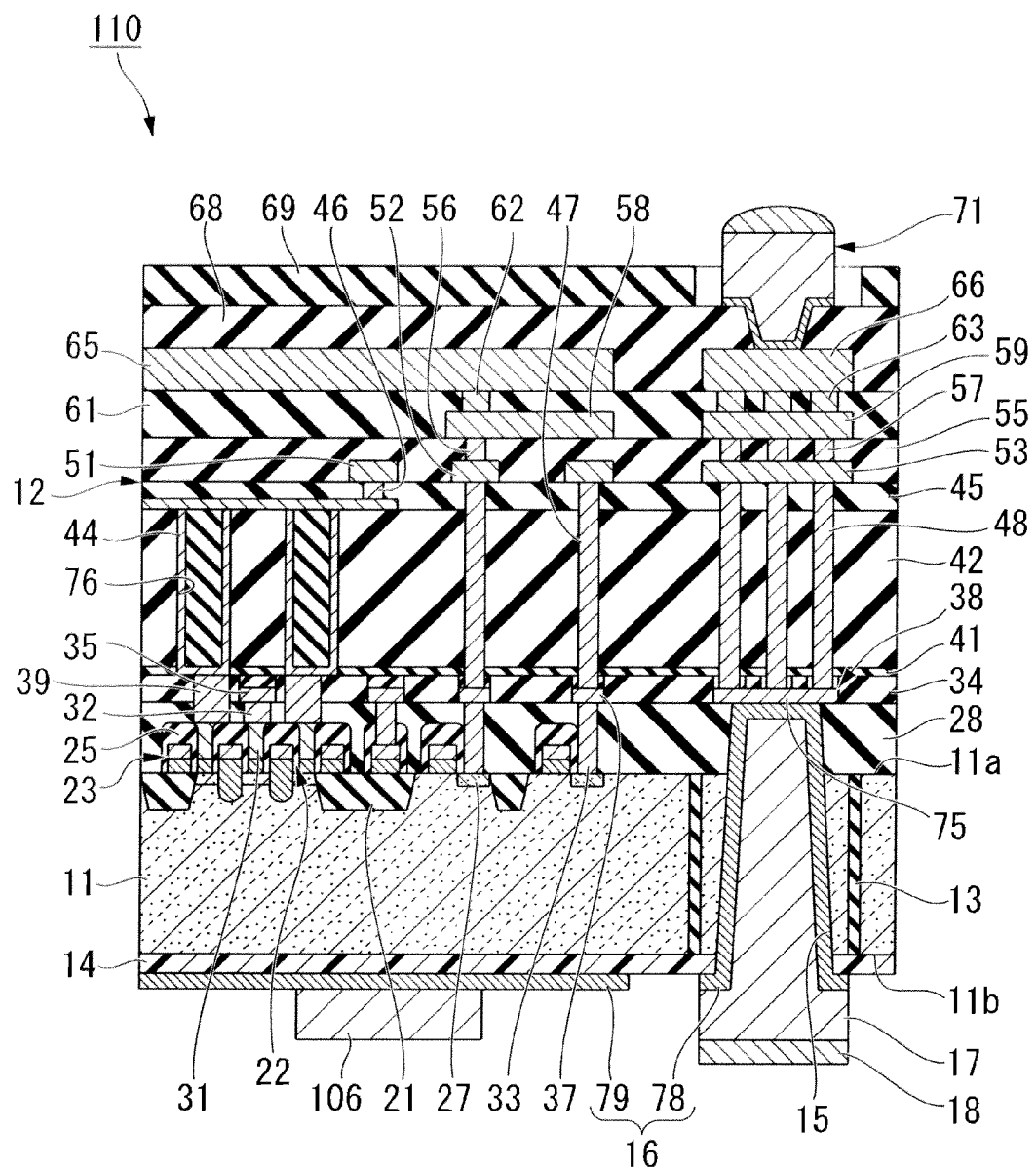
FIG. 23 is a cross-sectional view illustrating a semiconductor device (substrate structure) according to a third embodiment of the present invention.

FIG. 23 is a cross-sectional view illustrating a semiconductor device (substrate structure) 110 according to a third embodiment of the present invention. Like reference numerals denote like elements among the first to third embodiments.

The semiconductor device 110 of the third embodiment differs from the semiconductor device 105 of the second embodiment in that a plating film 106 is formed so as to partially cover the sheet-like second seed layer 79.

The provision of the plating film 106 partially covering the sheet-like second seed layer 79 enables reduction in local warpage of the semiconductor device 110. Additionally, if another substrate structure (not shown) is stacked on the semiconductor device 110, a stack of the semiconductor device 110 and the substrate structure can be warped in an integrated manner, thereby increasing the reliability of electrical connection between the semiconductor device 110 and the substrate structure.

Figure 24:
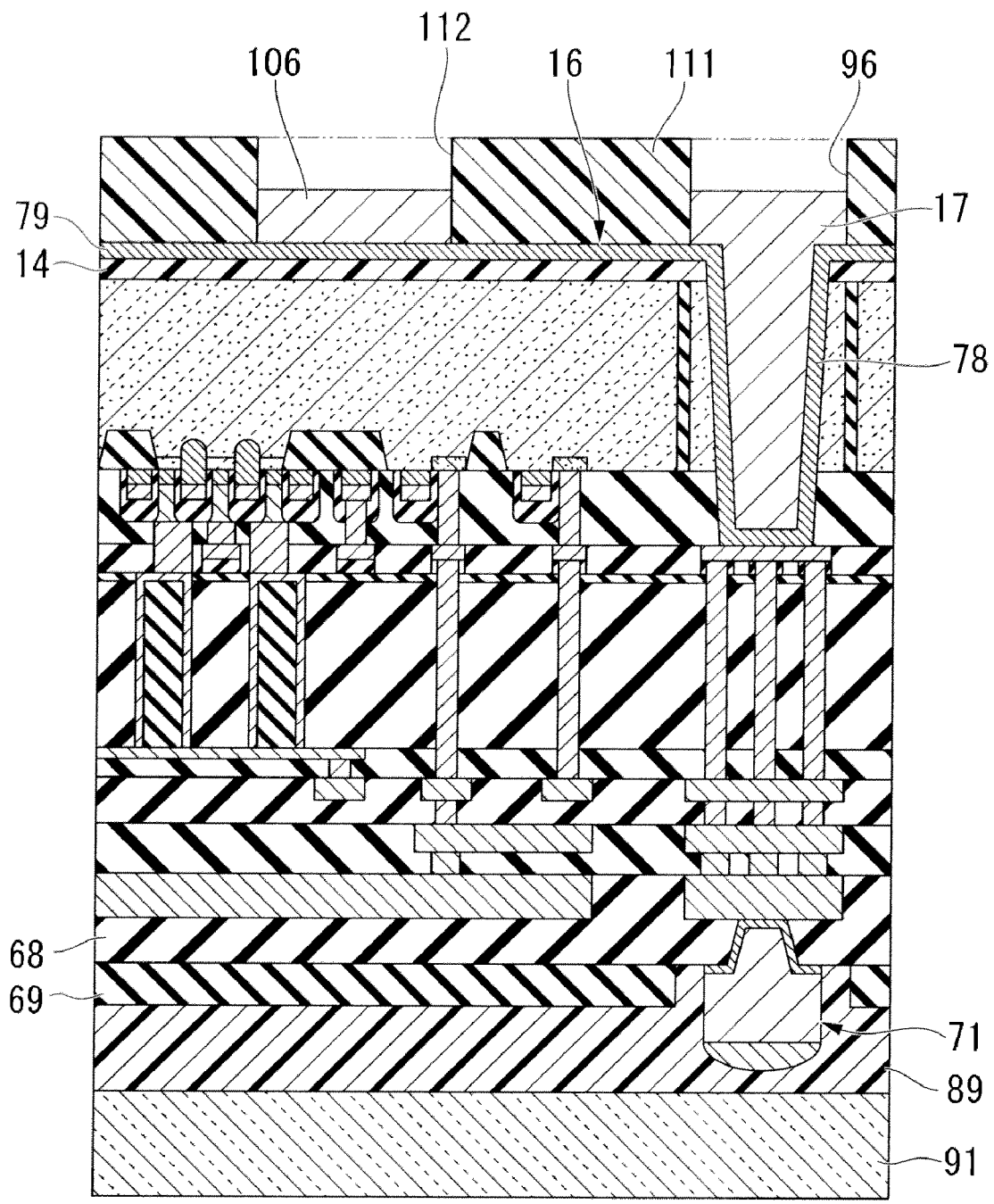
FIG. 24 is a cross-sectional view illustrating a method of forming a plating film of the third embodiment.

Hereinafter, a method of forming the plating film 106 partially covering the second seed layer 79 is explained. FIG. 24 is a cross-sectional view illustrating a method of forming the plating film 106.

After similar processes to those shown in FIGS. 5 to 13 are carried out, in a process shown in FIG. 24, a plating resist film 111 is formed over the rear seed layer 16. The plating resist film 111 has through holes 96 and 112. The through hole 96 exposes the first seed layer 78. The through hole 112 exposes a portion of the second seed layer 79, which will be a region of the plating film 106.

Then, the penetrating electrode 17 and the plating film 106 are formed at the same time by an electrolytic plating method with the rear seed layer 16 as a feed layer. The penetrating electrode 17 is made of a plating film filling the through hole 15 and part of the through hole 96. The plating film 106 fill a bottom portion of the through hole 112 so as to partially covers the second seed layer 79 (electrode formation process).

Accordingly, the plating film 106, which partially covers the second seed layer 79, can be formed without providing an additional process of forming the plating film 106 (i.e., without increasing the cost for manufacturing the semiconductor device 110).

After the plating film 106 and the penetrating electrode 17 are formed at the same time in the electrode formation process, the plating resist film 111 shown in FIG. 24 is removed. Then, the plating resist film 95 having the through hole 96 as shown in FIG. 13 is formed over the rear seed layer 16 so as to cover the plating film 106. Then, the plating layer 18 is formed by an electrolytic plating method over the penetrating electrode 17 exposed to the through hole 96. Then, the plating resist film 95 is removed. Then, similar processes to those shown in FIGS. 14 to 16 are carried out. Thus, the semiconductor device 110 of the third embodiment can be formed.

Although the case where the plating film 106 partially covering the sheet-like second seed layer 79 is formed has been explained in the third embodiment, the plating film 106 covering the net-like second seed layer 79 shown in FIG. 3 may be formed.

It is apparent that the present invention is not limited to the above embodiments, and may be modified and changed without departing from the scope and spirit of the invention.

For example, although a DRAM is taken as an example of the semiconductor devices 10, 105, and 110 of the first to third embodiments, the second seed layer 79 and the plating film 106 of the first to third embodiments, which are the warpage adjustment elements, are applicable to a semiconductor memory device other than the DRAM, such as SRAM (Static Random Access Memory), a PRAM (Phase change RAM), a flash memory, and the like. The second seed layer 79 and the plating film 106 are applicable to a semiconductor device other than those semiconductor memory devices.

Although the case where the second seed layer 79 and the plating film 106 are applied to the semiconductor devices 10, 105, and 110 including the semiconductor substrate 11 as a substrate body, the second seed layer 79 and the plating film 106 are applicable to a resin board (such as a glass epoxy board), a ceramic board, and the like.

Further, the present invention is applicable to a substrate structure including a pad electrode (other than the penetrating electrode), which is formed on a rear surface of a substrate by a plating method. In other words, the present invention is applicable to a substrate structure including, on a rear surface of a substrate, a conductor that is formed by a plating method.

Moreover, a substrate of the substrate structure is not limited to the semiconductor substrate, and may be a printed board, an insulating board, and the like.

The present invention is applicable to a method of manufacturing a substrate structure requiring adjustment of the degree of warpage, and a method of manufacturing a semiconductor device.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

What is claimed is:

1. A method of manufacturing a semiconductor device, comprising:
   forming a seed layer over a substrate, the seed layer including first, second, and third portions;
   forming a first electrode covering the first portion of the seed layer without forming an electrode on the second and third portions of the seed layer; and
   removing the third portion of the seed layer so that the first and second portions remain over the substrate, and the first and second portions are separated from each other.

2. The method according to claim 1, wherein
   the substrate has first and second surfaces, and
   the seed layer covers the first surface of the substrate.

3. The method according to claim 2, further comprising:
   before forming the seed layer, forming a wiring structure covering the second surface of the substrate; and
   forming a first hole extending from the first surface of the substrate and partially exposing the wiring structure,
   wherein forming the seed layer comprises forming the seed layer that covers an inner surface of the first hole and the first surface of the substrate, and
   forming the first electrode comprises forming the first electrode that fills the first hole.

4. The method according to claim 3, wherein
the wiring structure has a first surface opposing the first surface of the substrate, and
the method further comprises:
forming a second electrode partially covering the first surface of the wiring structure, the second electrode being electrically connected to the first electrode.

5. The method according to claim 1, wherein the third portion of the seed layer is positioned between the first and second portions.

6. The method according to claim 3, further comprising:
forming a plating film covering the second portion while forming the first electrode.

7. The method according to claim 1, further comprising:
forming a plating film covering a part of the second portion while forming the first electrode.

8. The method according to claim 1, wherein forming the first electrode is performed by a plating method.

9. A method of manufacturing a semiconductor device, comprising:
forming a first hole in a substrate;
forming a seed layer covering an inner surface of the first hole and the substrate, the seed layer including first, second, and third portions;
forming a first electrode covering the first portion of the seed layer without forming an electrode on the second and third portions of the seed layer, the first electrode filling the first hole; and
removing the third portion of the seed layer so that the first and second portions remain over the substrate, and the first and second portions are separated from each other.

10. The method according to claim 9, wherein forming the first electrode comprises:
forming a first mask covering the seed layer, the first mask having a second hole over the first hole, the second hole being larger in size than the first hole;
forming an electrode film filling the first hole and a part of the second hole; and
removing the first mask.

11. The method according to claim 10, further comprising:
forming a first plating film covering the electrode film.

12. The method according to claim 9, wherein removing the third portion of the seed layer comprises:
forming a second mask covering the first electrode and the second portion of the seed layer; and
removing the seed layer with the second mask.

13. The method according to claim 9, further comprising:
forming a second plating film covering the second portion while forming the first electrode.

14. The method according to claim 13, wherein forming the second plating film comprises:
forming a third mask covering the third portion of the seed layer, the third portion being positioned between the first and second portions; and
forming the first electrode and the second plating film by a plating method with the third mask.

15. The method according to claim 9, further comprising:
forming a third plating film covering a part of the second portion.

16. The method according to claim 15, wherein forming the third plating film comprises:
forming a fourth mask over the seed layer, the fourth mask having second and third holes, the second hole being positioned over the first hole, the second hole being larger in size than the first hole, and the third hole exposing a part of the second portion;
forming the first electrode and the third plating film by a plating method with the fourth mask.

17. A method of manufacturing a semiconductor device, comprising:
preparing a substrate having first and second surfaces;
forming a wiring structure covering the first surface of the substrate, the wiring structure having a first surface opposing the second surface of the substrate,
forming a first electrode partially covering the first surface of the wiring structure;
forming a seed layer covering the second surface of the substrate, the seed layer including first, second, and third portions;
forming a second electrode covering the first portion of the seed layer so as to be electrically connected to the first electrode, without forming an electrode on the second and third portions of the seed layer; and
removing the third portion of the seed layer so that the first and second portions remain over the second surface of the substrate, and the first and second portions are separated from each other.

18. The method according to claim 17, further comprising:
forming a first hole extending from the second surface of the substrate and reaching the wiring structure,
wherein forming the seed layer comprises forming the seed layer that covers an inner surface of the first hole and the second surface of the substrate, and
forming the second electrode comprises forming the second electrode that fills the first hole.

19. The method according to claim 18, further comprising:
before forming the first hole, forming an insulating film covering the first electrode and the first surface of the wiring structure in order to adjust a vertical size of the semiconductor device.

20. The method according to claim 17, wherein forming the second electrode is performed by a plating method.

* * * * *